(12) United States Patent
Hirabayashi

(10) Patent No.: US 6,661,025 B2
(45) Date of Patent: Dec. 9, 2003

(54) METHOD OF MANUFACTURING ELECTRO-OPTICAL APPARATUS SUBSTRATE, ELECTRO-OPTICAL APPARATUS SUBSTRATE, ELECTRO-OPTICAL APPARATUS AND ELECTRONIC APPARATUS

(75) Inventor: Yukiya Hirabayashi, Suwa (JP)

(73) Assignee: Seiko Epson Corporation, Tokyo (JP)

(*) Notice: Subject to any disclaimer, the term of this patent is extended or adjusted under 35 U.S.C. 154(b) by 74 days.

(21) Appl. No.: 09/945,830

(22) Filed: Sep. 5, 2001

(65) Prior Publication Data

US 2002/0037600 A1 Mar. 28, 2002

(30) Foreign Application Priority Data

Sep. 22, 2000 (JP) .......................... 2000-288460
Sep. 25, 2000 (JP) .......................... 2000-291005

(51) Int. Cl.$^7$ .................... H01L 29/04; H01L 31/036
(52) U.S. Cl. .................... 257/53; 257/72; 438/57; 438/149
(58) Field of Search .................... 438/57, 149, 691, 438/692; 257/53, 72, 659

(56) References Cited

U.S. PATENT DOCUMENTS 6,317,175 B1 * 11/2001 Salerno et al. ............. 349/45
6,335,540 B1 *  1/2002 Zhang ....................... 257/53

FOREIGN PATENT DOCUMENTS

JP        A 10-293320       11/1998

* cited by examiner

Primary Examiner—Caridad Everhart
(74) Attorney, Agent, or Firm—Oliff & Berridge, PLC

(57) ABSTRACT

A method of manufacturing an electro-optical apparatus substrate (10), includes the processes of: forming a light shield layer on one surface of an optically transparent substrate; patterning the light shield layer to thereby form a patterned light shield layer (11a) at least in a formation region of each transistor element (30) to be formed; forming a first insulation layer (12A) above the one surface of the optically transparent substrate above which the patterned light shield layer has been formed; forming a second insulation layer (12B) having a polishing rate lower than that of the first insulation layer, on the first insulation layer; polishing a surface of the second insulation layer; laminating a single crystal silicon layer (206) on the polished surface of the second insulation layer; and forming the each transistor element by using the single crystal silicon layer.

37 Claims, 18 Drawing Sheets

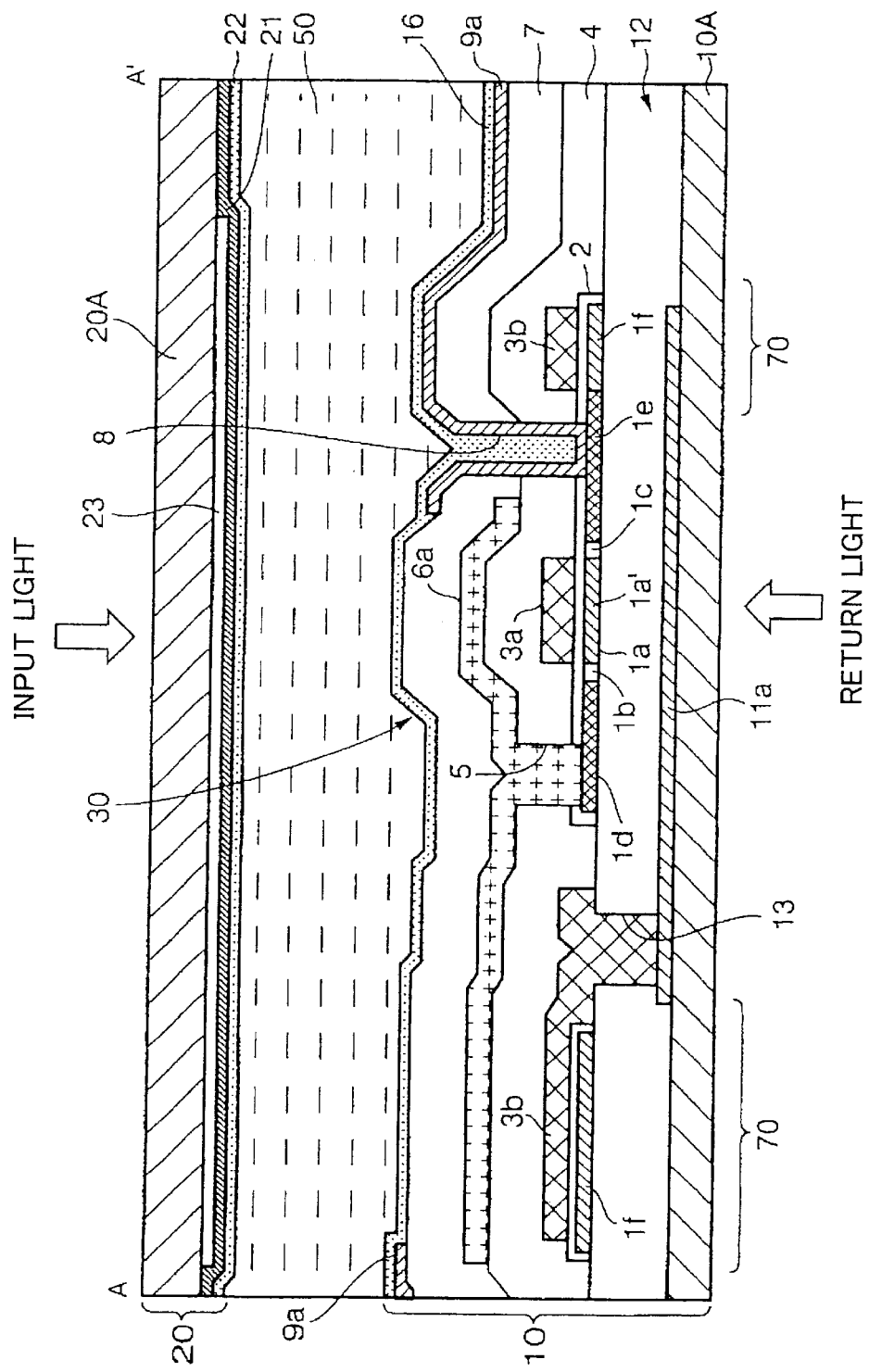

NON-FORMATION REGION OF TRANSISTOR ELEMENT

FORMATION REGION OF TRANSISTOR ELEMENT

NON-FORMATION REGION OF TRANSISTOR ELEMENT

FORMATION REGION OF TRANSISTOR ELEMENT

NON-FORMATION REGION OF TRANSISTOR ELEMENT

FORMATION REGION OF TRANSISTOR ELEMENT

NON-FORMATION REGION OF TRANSISTOR ELEMENT | FORMATION REGION OF TRANSISTOR ELEMENT

NON-FORMATION REGION OF TRANSISTOR ELEMENT | FORMATION REGION OF TRANSISTOR ELEMENT

NON-FORMATION REGION OF TRANSISTOR ELEMENT | FORMATION REGION OF TRANSISTOR ELEMENT

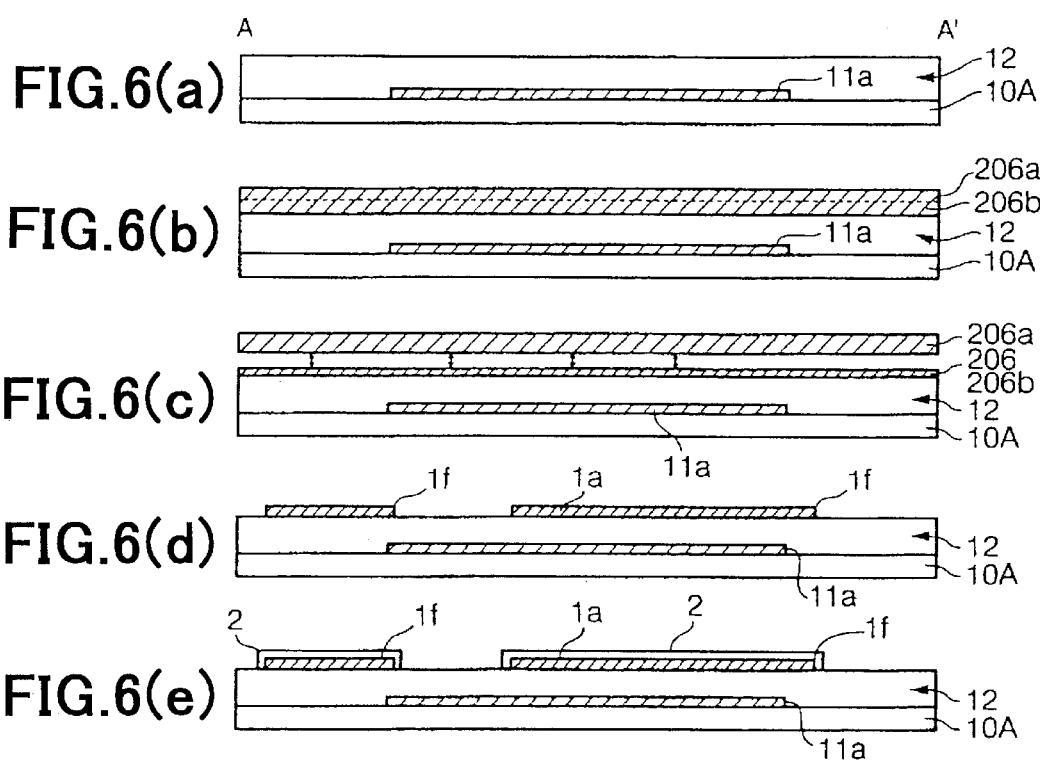

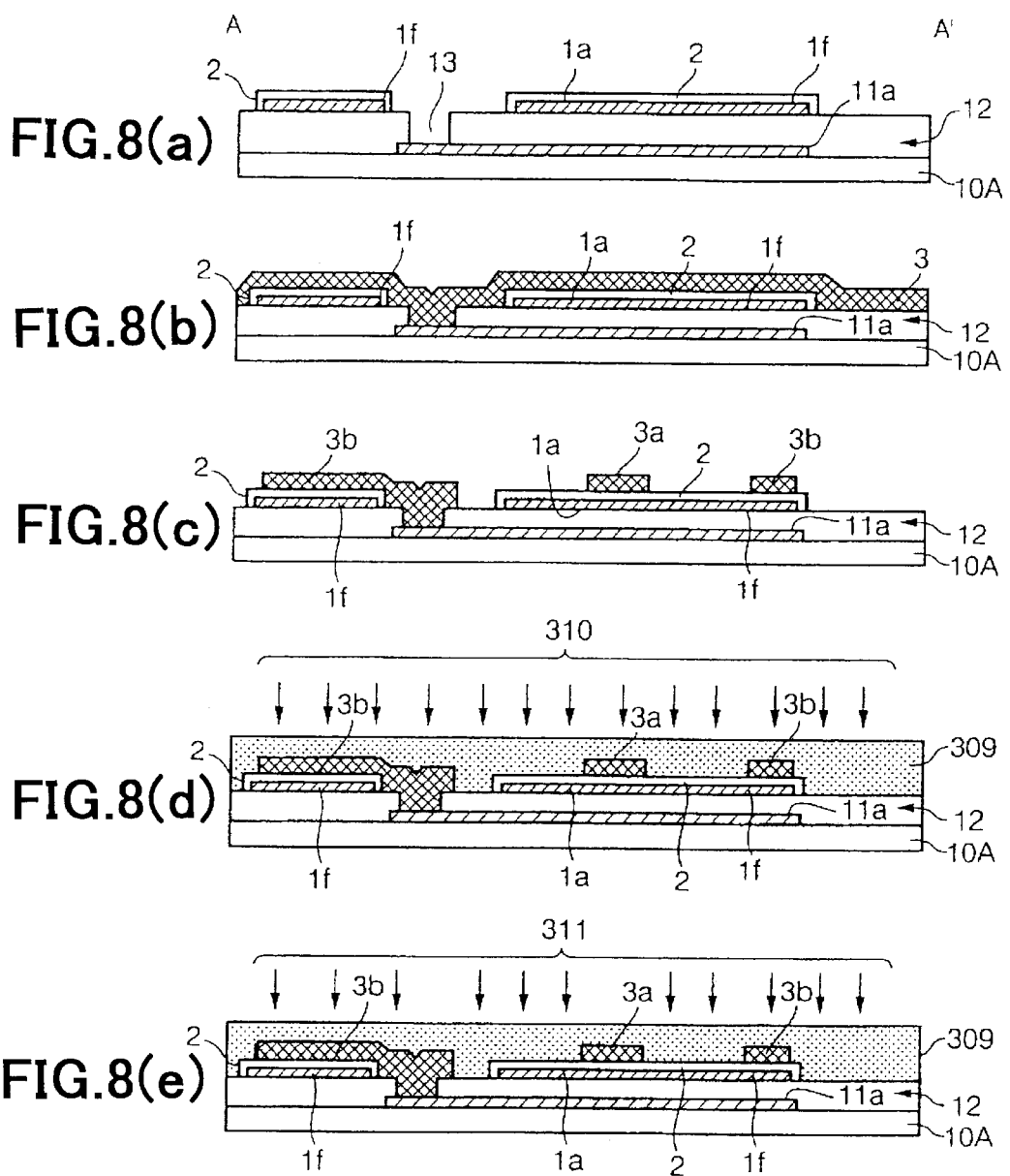

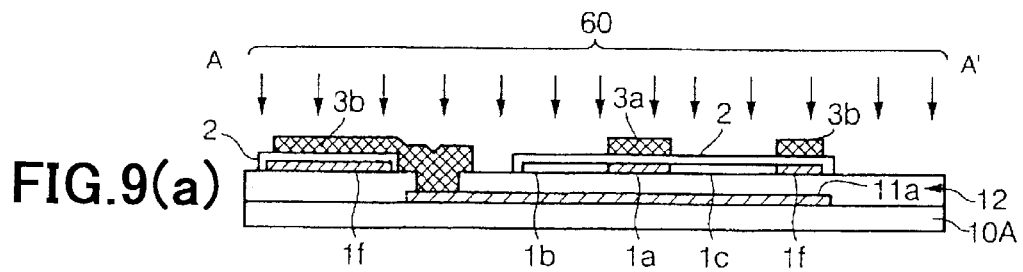
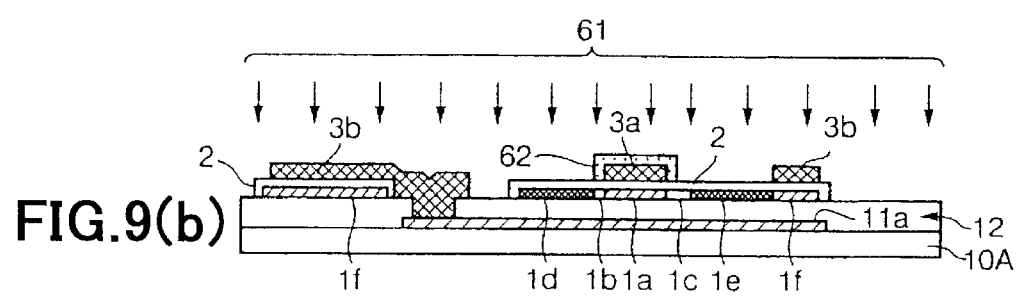
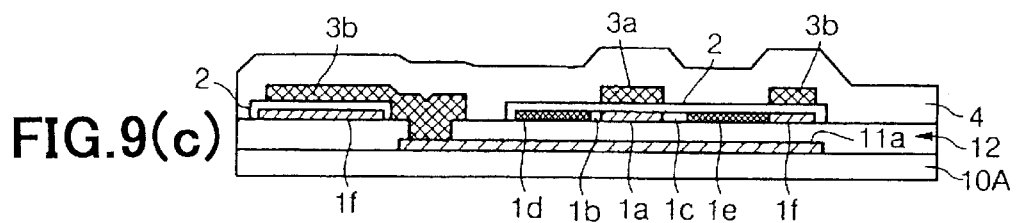
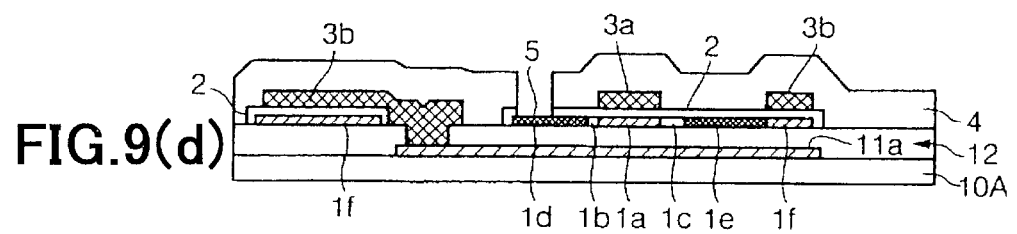

NON-FORMATION REGION OF TRANSISTOR ELEMENT | FORMATION REGION OF TRANSISTOR ELEMENT

NON-FORMATION REGION OF TRANSISTOR ELEMENT | FORMATION REGION OF TRANSISTOR ELEMENT

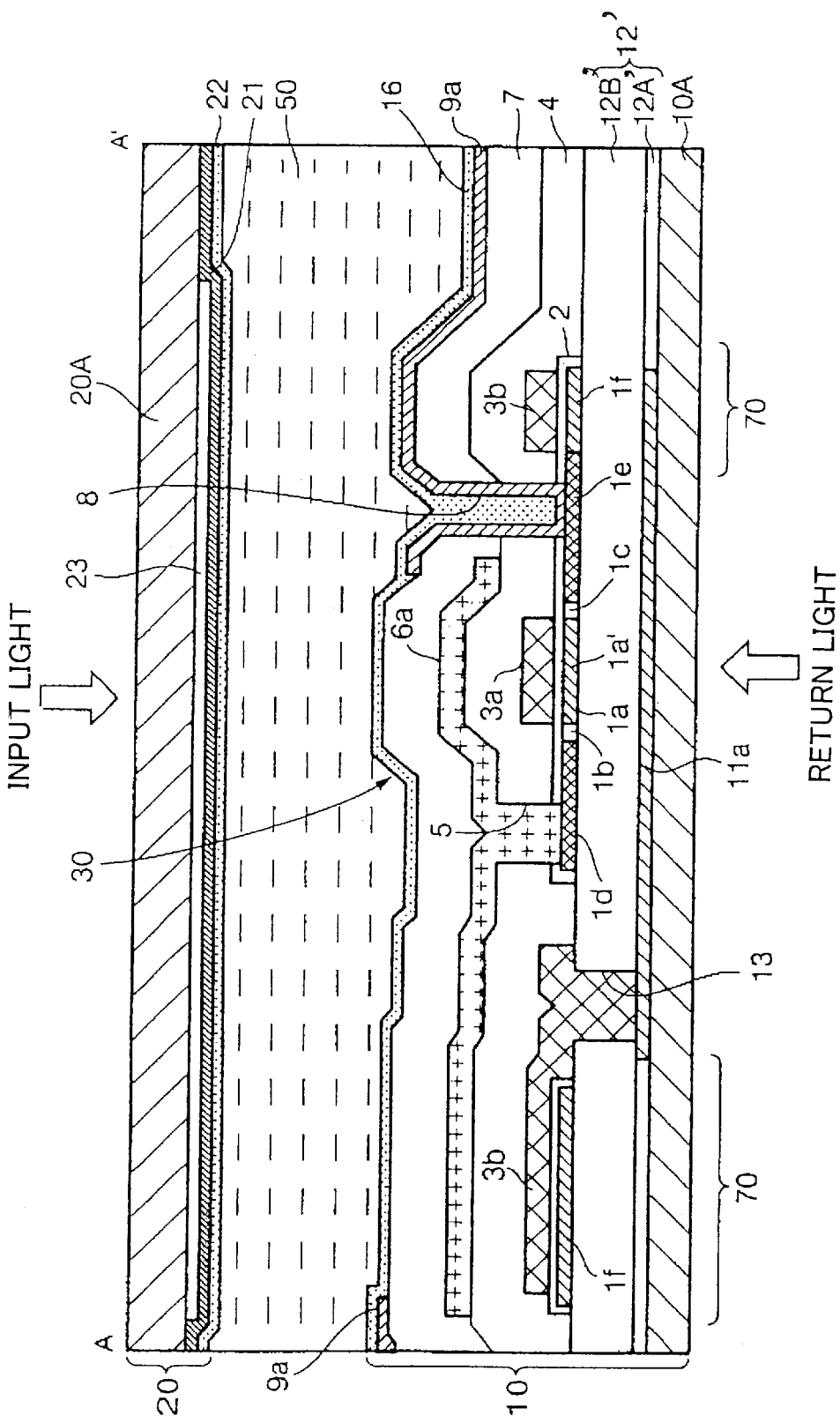

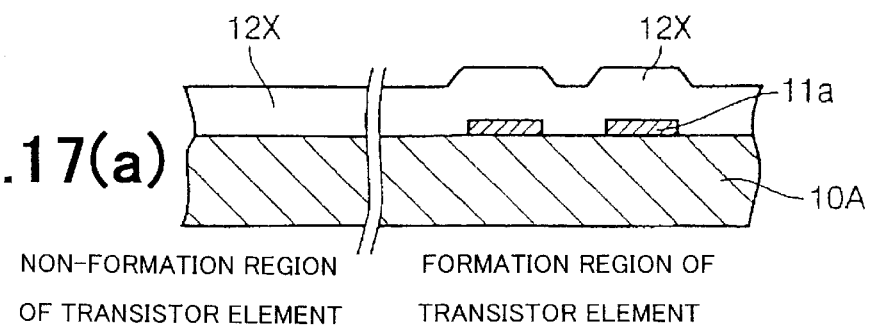
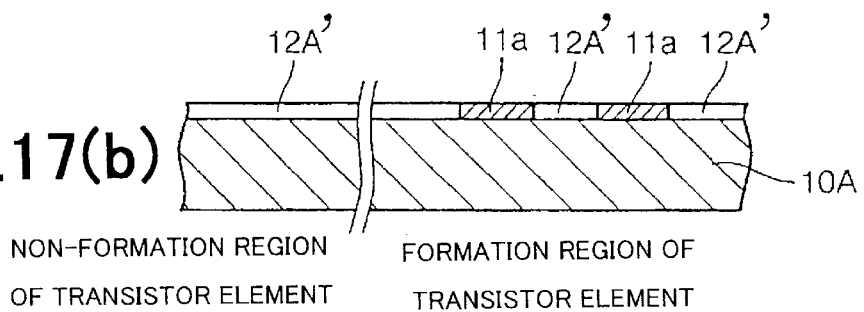
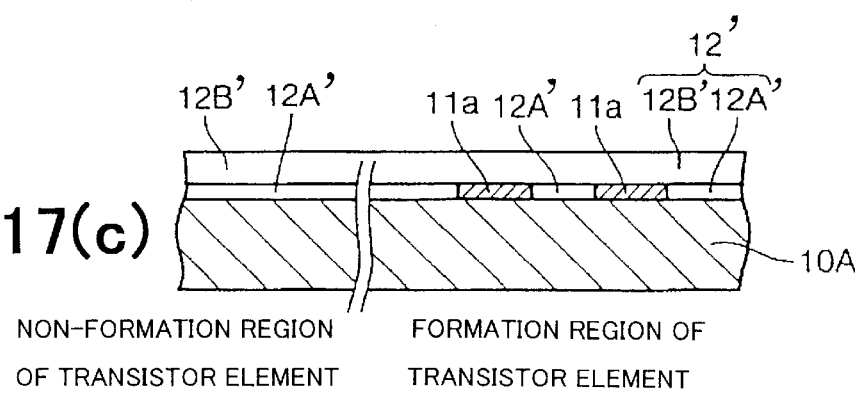

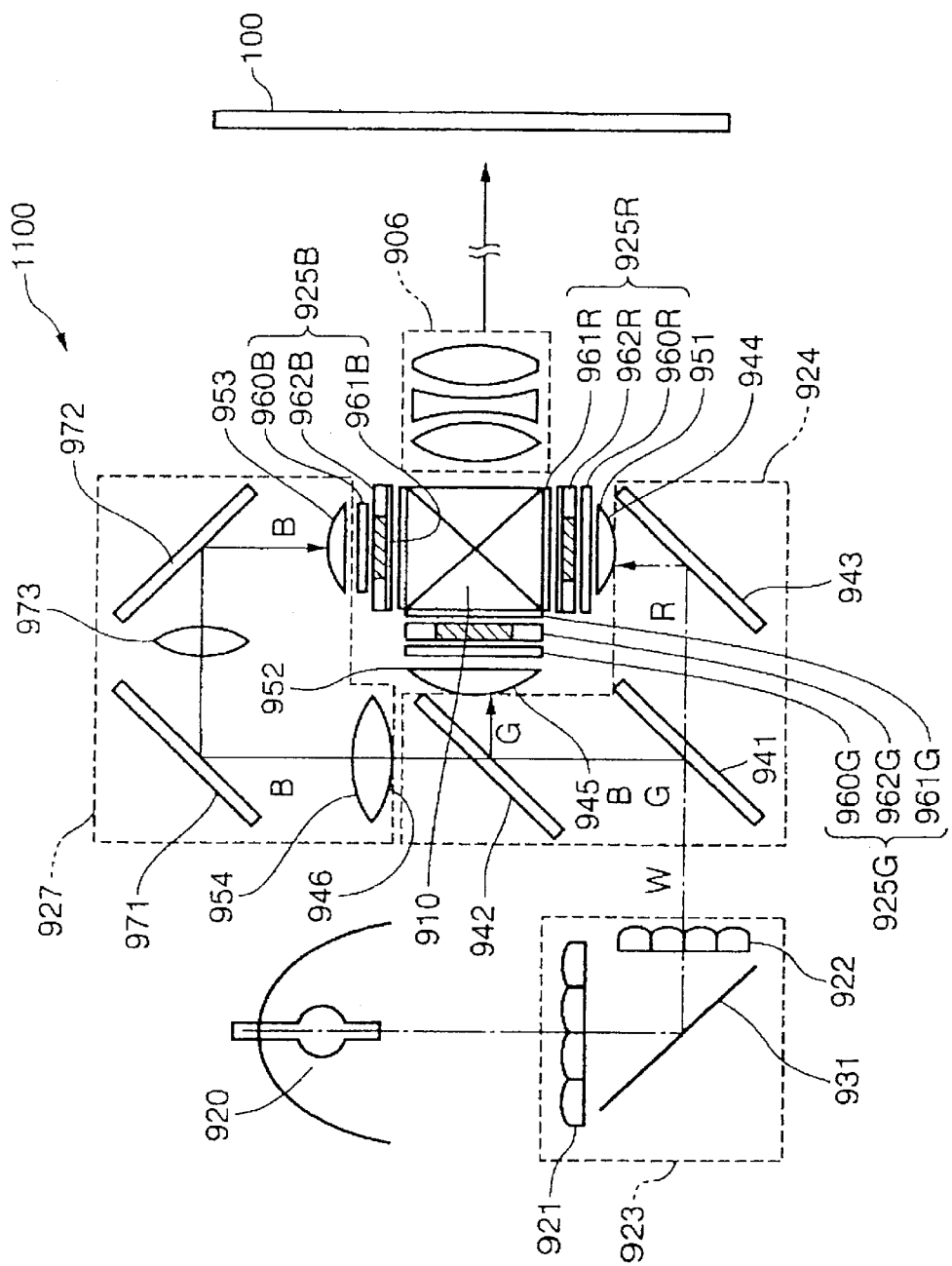

METHOD OF MANUFACTURING ELECTRO-OPTICAL APPARATUS SUBSTRATE, ELECTRO-OPTICAL APPARATUS SUBSTRATE, ELECTRO-OPTICAL APPARATUS AND ELECTRONIC APPARATUS

BACKGROUND OF THE INVENTION

1. Field of the Invention

The present invention relates to a method of manufacturing an electro-optical apparatus substrate that sequentially has a light shield layer of a predetermined pattern, an insulation layer and a transistor element on a surface of an optically transparent substrate, an electro-optical apparatus substrate which is manufactured by the manufacturing method, an electro-optical apparatus having the electro-optical apparatus substrate, and an electronic apparatus.

2. Description of the Related Art

An SOI (Silicon On Insulator) technique for forming a single crystal silicon thin film on an insulating substrate and then forming a semiconductor device of the single crystal silicon thin film has the merits of making a speed of an element faster, making a consumption power lower and making an integration degree higher. Thus, it is preferably used in an electro-optical apparatus, for example, such as a liquid crystal device and the like.

When the SOI technique is applied to the electro-optical apparatus as mentioned above, a single crystal silicon layer of a thin film is formed by laminating a single crystal silicon substrate on an optically transparent substrate and then polishing it. So, a transistor element, for example, such as MOSFET for driving a liquid crystal or the like, is constituted by the single crystal silicon layer.

By the way, in a projection display, for example, such as a projector using a liquid crystal device or the like, a light is inputted from the side of the optically transparent substrate (i.e., one surface of the liquid crystal device) which is one of the two substrates constituting the liquid crystal device. In order to prevent a light leak current from being generated as this light is inputted to a channel region of the transistor element formed on the surface of the other substrate, it is typically designed to form a light shield layer on the side of the transistor element, at which the light is inputted.

However, even if the light shield layer is formed on the side of the transistor element at which the light is inputted, when the substrate on which the transistor element is formed has the optically transparent property, the light inputted to the liquid crystal device may be reflected on a boundary face of a rear of the substrate on which the transistor element is formed, and may be inputted to the channel portion of the transistor element as a return light. This return light is little as a rate with respect to an amount of the lights inputted from the surface of the liquid crystal device. However, there may be the considerable possibility that the light leak current is generated in an apparatus using a very strong light source such as a projector or the like. That is, the return light from the rear of the substrate on which the transistor element is formed has an influence on a switching property of the element, and causes the performance of the element to be deteriorated. By the way, here, let us suppose that the plane on which the single crystal silicon layer is formed is referred to as the surface of the substrate, and the opposite side is referred to as the rear.

Japanese Laid Open Patent Application (JP-A-Heisei, 10-293320) proposes a technique for forming a light shield layer on a surface of a substrate on which transistor elements are formed, correspondingly to each transistor element. This proposes a method of forming the light shield layer of a predetermined pattern on the substrate surface, and forming an insulation layer on the light shield layer, and then polishing and smoothing a surface of the insulation layer and laminating or bonding a single crystal silicon substrate on the polished surface.

However, in the typical electro-optical apparatus, the transistor elements are formed only in a display region (pixel portion) on the surface of the substrate, and the transistor elements are not formed in a non-display region. In this way, there are the region in which the transistor elements are crowded (the formation region) and the non-crowded region (the non-formation region) in which the transistor elements are not crowded. For this reason, each piece of light shield layers disposed correspondingly to the respective transistor elements are distributed at the similar density. As a result, concave and convex portions are formed on a surface of the insulation layer formed on the light shield layers, and a certain distribution is also induced in those concave and convex portions. Thus, even if the surface of the insulation layer is polished, the variation in the polished degree is induced on the surface of the substrate. So, even if the entire surface of the substrate is polished, the insulation layer becomes relatively thick in the portion where the convex portions are crowded, and the insulation layer becomes relatively thin in the portion where the convex portions are not crowded (i.e., the portion where the concave portions are crowded). Hence, this leads to the fear of the degradation in the smoothness or flatness on the surface of the insulation layer after the polishing operation.

For example, as shown in FIG. 19(*a*), assuming that a region 1010 where light shield layers 1003 are crowded and a region 1020 where the shield layers 1003 are not crowded exist on a surface of a substrate 1001, the number and the area of concave portions formed on the region 1020 where the light shield layers 1003 are not crowded are greater and wider than those of the region 1010 where the light shield layers 1003 are crowded, on a surface of an insulation layer 1004 formed on the substrate 1001 on which the light shield layers 1003 have been formed. By the way, even in the region 1010 where the light shield layers 1003 are crowded, minute concave and convex portions are formed on the surface of the insulation layer 1004, depending on the patterns of the light shield layers 1003. However, they are omitted on FIG. 19(*a*), for the simplicity.

As mentioned above, if the surface of the insulation layer 1004 having the distribution in the concave and convex portions is polished, the region in which the area of the convex portions is narrower (i.e., the region 1020 where the light shield layers: 1003 are not crowded) is polished faster than the region in which the area of the convex portions is wider (i.e., the region 1010 where the light shield layers 1003 are crowded), on the surface of the insulation layer 1004. As a result, as shown in FIG. 19(*b*), the insulation layer 1004 in the region 1020 where the light shield layers 1003 are not crowded is excessively polished, which causes a stage difference between the region 1010 where the light shield layers 1003 are crowded and the region 1020 where they are not crowded, on the surface of the insulation layer 1004. Accordingly, the smoothness on the surface of the insulation layer 1004 is made lower.

As mentioned above, the drop in the smoothness on the surface of the insulation layer brings about the following problems. As the first problem, there may be the fear that a void is induced on the lamination boundary between the insulation layer and the single crystal silicon layer, and this causes the deterioration in the performance of the transistor element formed in the region where this void exists. As the second problem, there may be the fear that the strength of the lamination between the insulation layer and the single crystal silicon layer is reduced, which causes the defect of film strip and the like to be induced in the process of forming the transistor element after the formation of the single crystal silicon layer, and thereby results in the drop in a yield of a product.

In addition, even if the insulation layer surface can be smoothed or flattened, there is no method of detecting an ending point of polishing i.e., a moment when the insulation layer has been completely smoothed. Thus, the polishing process is controlled only by the polishing time duration. However, since the polishing rate is changed due to various factors such as a batch or lot of the used polishing liquid, a difference in the type of the polishing machined and the like, the time duration by which the insulation layer has been completely smoothed is also changed due to the actual polishing condition at that time. Accordingly, there may arise such a case that the surface of the insulation layer cannot be completely smoothed, even if polishing is conducted for a constant time duration.

SUMMARY OF THE INVENTION

The present invention is proposed in view of the above mentioned problems. It is therefore an object of the present invention to provide: a method of manufacturing an electro-optical apparatus substrate such that an insulation layer surface on which a single crystal silicon layer is laminated can be smoothed; the electro-optical apparatus substrate; an electro-optical apparatus having the electro-optical apparatus substrate; and an electronic apparatus having the electro-optical apparatus.

It is another object of the present invention to provide: a method of manufacturing an electro-optical apparatus substrate such that s surface of an optically transparent substrate on which a light shielding layer and an insulation layer are formed and on which a single crystal silicon layer is laminated can be smoothed, and that the ending point of polishing can be easily detected at the time of polishing the insulation layer; the electro-optical apparatus substrate; an electro-optical apparatus having the electro-optical apparatus substrate; and an electronic apparatus having the electro-optical apparatus.

The inventor of the present invention found out that, in a case that the area of the concave portions is relatively large on the surface of the optically transparent substrate such as a case that the light shield layer is formed only in the formation region of the transistor elements, it is possible to achieve the above mentioned object by the following method, so that the surface of the insulation layer on which the single crystal silicon layer is laminate can be smoothed.

Namely, the above object of the present invention can be achieved by a first method of manufacturing an electro-optical apparatus substrate, including the processes of: forming a light shield layer above one surface of an optically transparent substrate; patterning the light shield layer to thereby form a patterned light shield layer at least in a formation region of each transistor element to be formed; forming a first insulation layer above the one surface of the optically transparent substrate above which the patterned light shield layer has been formed; forming a second insulation layer having a polishing rate lower than that of the first insulation layer, on the first insulation layer; polishing a surface of the second insulation layer; laminating a single crystal silicon layer above the polished surface of the second insulation layer; and forming the each transistor element by using the single crystal silicon layer.

The inventor of the present invention found out that, in a case that the area of the concave portions is relatively large on the surface of the optically transparent substrate such as a case that the light shield layer is formed only in the formation region of the transistor elements, it is possible to smooth the surface of the insulation layer, by polishing the surface of the substrate after (i) forming the first insulation layer on the optically transparent substrate on which the patterned light shield layer has been formed and (ii) forming the second insulation layer whose polishing rate is lower than (i.e., which is polished slower than) the first insulation layer, by virtue of the existence of the second insulation layer to prevent the excessively polished portion from being generated. In addition, the reason why the surface of the insulation layer can be smoothed by this method will be explained in more detail in the embodiment section.

In one aspect of the first method of the present invention, the first insulation layer is partially exposed by the step of polishing the surface of the second insulation layer.

In this aspect, a height of an exposed surface of the first insulation layer with respect to the one surface of the optically transparent substrate may be same as that of the polished surface of the second insulation layer.

In another aspect of the first method of the present invention, at the step of patterning the light shield layer, the patterned light shield layer is formed only in the formation region of the each transistor element.

The inventor of the present invention also found out that, in a case that the area of the concave portions is relatively small on the surface of the optically transparent substrate such as a case that the light shield layer is formed also in the non-formation region of the transistor elements, it is possible to achieve the above mentioned object by the following method, so that the surface of the insulation layer on which the single crystal silicon layer is laminate can be smoothed.

Namely, the above object of the present invention can be also achieved by a second method of manufacturing an electro-optical apparatus substrate, including the processes of: forming a light shield layer above one surface of an optically transparent substrate; patterning the light shield layer to thereby form a patterned light shield layer at least in a formation region of each transistor element to be formed; forming a first insulation layer above the one surface of the optically transparent substrate above which the patterned light shield layer has been formed; forming a second insulation layer having a polishing rate lower than that of the first insulation layer, on the first insulation layer; forming a third insulation layer having a polishing rate higher than that of the second insulation layer, on the second insulation layer; polishing a surface of the third insulation layer; laminating a single crystal silicon layer above the polished surface of the third insulation layer; and forming the each transistor element by using the single crystal silicon layer.

The inventor of the present invention found out that, in a case that the area of the concave portions is relatively small on the surface of the optically transparent substrate such as a case that the light shield layer is formed also in the non-formation region of the transistor elements, it is possible to smooth the surface of the insulation layer, by polishing the surface of the substrate after (i) forming the first insulation layer on the optically transparent substrate on which the patterned light shield layer has been formed (ii)

forming the second insulation layer whose polishing rate is lower than (i.e., which is polished slower than) the first insulation layer, and (iii) forming the third insulation layer whose polishing rate is higher than (i.e., which is polished faster than) the second insulation layer, by virtue of the existence of the second insulation layer to prevent the excessively polished portion from being generated. In addition, the reason why the surface of the insulation layer can be smoothed by this method will be explained in more detail in the embodiment section.

In one aspect of the second method of the present invention, the second insulation layer is partially exposed by the step of polishing the surface of the third insulation layer.

In this aspect, a height of an exposed surface of the second insulation layer with respect to the one surface of the optically transparent substrate may be same as that of the polished surface of the third insulation layer.

In another aspect of the second method of the present invention, at the step of patterning the light shield layer, the patterned light shield layer is formed in a non-formation region of the each transistor element where the each transistor element is not formed.

The above object of the present invention can be also achieved by a third method of manufacturing an electro-optical apparatus substrate, including the processes of: forming a light shield layer above one surface of an optically transparent substrate; patterning the light shield layer to thereby form a patterned light shield layer at least in a formation region of each transistor element to be formed; forming an insulation layer on the one surface of the optically transparent substrate on which the patterned light shield layer has been formed; polishing a surface of the insulation layer until a surface of the patterned light shield layer is exposed; laminating a single crystal silicon layer above the polished surface of the insulation layer and the exposed surface of the patterned light shield layer; and forming the each transistor element by using the single crystal silicon layer.

The present inventor found out that, by forming the insulation layer on the optically transparent substrate on which the light shield layer has been formed and then polishing the surface until the light shield layer is exposed in this manner, it is possible to smooth the surface of the optically transparent substrate onto which the single crystal silicon layer is laminated, and it is also possible to easily detect the stopping point of polishing by giving the polishing stopper function to the light shield layer, by using the fact that the materials of the light shield layer and the insulation layer are different from each other.

For example, in case of using the CMP method, since the light shield layer comprising metal etc., does not chemically react with the polishing liquid, at the moment when the surface of the light shield layer is exposed, the friction force between the polishing pad for polishing the optically transparent substrate and the optically transparent substrate is certainly dropped. Also, the vibration of the substrate holder for holding the optically transparent substrate is certainly changed. Therefore, by detecting the friction force between the polishing pad and the optically transparent substrate or the vibration of the substrate holder, it is possible to easily detect the stopping point of polishing.

In the present application, "the light shield layer has a polishing stopper function" means that "the stopping point of polishing is detected by detecting the moment when the surface of the light shield layer is exposed" as described above.

Also, sine the oxide film is formed in advance on the surface of the single crystal silicon substrate used for lamination at its side of lamination, it is possible to prevent the pollution from the light shield layer to the transistor element, even if the formation of the transistor element is performed after laminating the single crystal silicon substrate directly onto the surface of the light shield layer comprising metal etc., and then make this single crystal silicon substrate thinner to be the single crystal silicon layer.

However, even in a case that the oxide film is formed on the surface of the single crystal silicon substrate, if this surface oxide film is very thin or the like so that there is a possibility of the pollution from the light shield layer to the transistor element, it is desirable to form an insulation layer on the surface of the light shield layer, before laminating the single crystal silicon substrate. In such a case, the following fourth method is desirable.

Namely, the above object of the present invention can be also achieved by a fourth method of manufacturing an electro-optical apparatus substrate, including the processes of: forming a light shield layer above one surface of an optically transparent substrate; patterning the light shield layer to thereby form a patterned light shield layer at least in a formation region of each transistor element to be formed; forming a first insulation layer on the one surface of the optically transparent substrate on which the patterned light shield layer has been formed; polishing a surface of the first insulation layer until a surface of the patterned light shield layer is exposed; forming a second insulation layer above the polished surface of the first insulation layer; laminating a single crystal silicon layer above the second insulation layer; and forming the each transistor element by using the single crystal silicon layer.

According to the fourth method of the present invention, by forming the first insulation layer on the optically transparent substrate on which the light shield layer has been formed, and by polishing the surface of the optically transparent substrate on which the first insulation layer has been formed until the surface of the light shield layer is exposed, the surfaces of the first insulation layer and the light shield layer are smoothed. After that, by forming the second insulation layer, since the surface of the second insulation layer is smoothed, it is possible to smooth the surface of the optically transparent substrate onto which the single crystal silicon layer is laminated. Further in this case, since the second insulation layer is formed between the light shield layer and the transistor element, it is possible to almost perfectly prevent the pollution from the light shield layer to the transistor element.

According to the above described first to fourth methods of the present invention, since the surface of the insulation layer can be smoothed, there is no or little void on the lamination boundary between the insulation layer, so that it is possible to prevent the property of the transistor element form being deteriorated. Further, since the lamination strength between the insulation layer and the single crystal silicon layer is strong, it is possible to prevent a defect such as a film strip or the like from being induced in the process of forming the transistor element, so that the yield can be improved.

The above object of the present invention can be also achieved by a first electro-optical apparatus substrate provided with a patterned light shield layer having a predetermined pattern, an insulation film and a transistor, which are sequentially formed above one surface of an optically transparent substrate, the insulation film comprising (i) a first insulation layer and (ii) a second insulation layer, which is partially formed on the first insulation layer and whose polishing rate is lower than that of the first insulation layer, so that a surface of the insulation film is smoothed, the transistor element having a semiconductor layer comprising a single crystal silicon layer.

According to the first electro-optical apparatus substrate of the present invention, which can be manufactured by the above described first method of the present invention, there is no or little void on the lamination boundary between the insulation layer and the single crystal silicon layer, the lamination strength between the insulation layer and the single crystal silicon layer is strong, the variation and the defect are hardly induced in the property of the transistor element.

In one aspect of the first electro-optical apparatus substrate of the present invention, the patterned light shield layer is formed only in an formation region of the transistor element.

In another aspect of the first electro-optical apparatus substrate of the present invention, the first insulation layer comprises silicon oxide, and the second insulation layer comprises silicon nitride.

The above object of the present invention can be also achieved by a second electro-optical apparatus substrate provided with a patterned light shield layer having a predetermined pattern, an insulation film and a transistor, which are sequentially formed above one surface of an optically transparent substrate, the insulation film comprising (i) a first insulation layer, (ii) a second insulation layer, which is formed on the first insulation layer and whose polishing rate is lower than that of the first insulation layer, and (iii) a third insulation layer, which is partially formed on the second insulation layer and whose polishing rate is higher than that of the second insulation layer, so that a surface of the insulation film is smoothed, the transistor element having a semiconductor layer comprising a single crystal silicon layer.

According to the second electro-optical apparatus substrate of the present invention, which can be manufactured by the above described second method of the present invention, there is no or little void on the lamination boundary between the insulation layer and the single crystal silicon layer, the lamination strength between the insulation layer and the single crystal silicon layer is strong, the variation and the defect are hardly induced in the property of the transistor element.

In one aspect of the second electro-optical apparatus substrate of the present invention, the patterned light shield layer is formed in a non-formation region of the each transistor element where the each transistor element is not formed.

In another aspect of the second electro-optical apparatus substrate of the present invention, the first insulation layer and the third insulation layer comprise silicon oxide, and the second insulation layer comprises silicon nitride.

The above object of the present invention can be also achieved by a third electro-optical apparatus substrate provided with: a patterned light shield layer having a predetermined pattern above one surface of an optically transparent substrate; an insulation layer which is formed above the one surface of the optically transparent substrate at an area where the patterned light shield layer is not formed, which has a thickness same as that of the patterned light shield layer, and whose surface is smoothed; a transistor element, which is formed above the patterned light shield layer and has a semiconductor layer comprising a single crystal silicon layer.

According to the third electro-optical apparatus substrate of the present invention, which can be manufactured by the above described third or fourth method of the present invention, there is no or little void on the lamination boundary between the insulation layer and the single crystal silicon layer, the lamination strength between the insulation layer and the single crystal silicon layer is strong, the variation and the defect are hardly induced in the property of the transistor element.

In one aspect of the third electro-optical apparatus substrate of the present invention, the insulation layer is formed by polishing a surface of an insulation film formed on the one surface of the optically transparent substrate on which the patterned light shield layer has been formed, the patterned light shield layer functioning as a stopper for polishing in a process of polishing the insulation film.

In another aspect of the third electro-optical apparatus substrate of the present invention, on the surfaces of the patterned light shield layer and the insulation layer, a second insulation layer is formed, the transistor element being disposed on a surface of the second insulation layer.

The above object of the present invention can be also achieved by an electro-optical apparatus provided with: (A) any one of the above described first, second and third electro-optical apparatus substrate of the present invention; (B) another optically transparent substrate disposed to be opposed to the one surface of the optically transparent substrate of the electro-optical apparatus substrate; and (C) an electro-optical material layer sandwiched between the two optically transparent substrates.

According to the electro-optical apparatus of the present invention, since it is provided with the electro-optical apparatus substrate according to the present invention, it is possible to provide the electro-optical apparatus, such as an LCD or the like, having the excellent performance.

The above object of the present invention can be also achieved by an electronic apparatus provided with the above described electro-optical apparatus of the present invention.

According to the electronic apparatus of the present invention, since it is provided with the electro-optical apparatus according to the present invention, it is possible to provide the electronic apparatus, such as a projector or the like, having the excellent performance.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

FIG. 3 is a sectional view taken on the line A–A' of FIG. 2 in the first embodiment;

FIGS. 6(a) to 6(e) are process diagrams showing the method of manufacturing the electro-optical apparatus substrate of the first embodiment according to the present invention;

FIGS. 8(a) to 8(e) are process diagrams showing the method of manufacturing the electro-optical apparatus substrate of the first embodiment according to the present invention;

FIGS. 9(a) to 9(d) are process diagrams showing the method of manufacturing the electro-optical apparatus substrate of the first embodiment according to the present invention;

FIG. 16 is a sectional view taken on the line A–A' of FIG. 2 in a third embodiment according to the present invention;

FIGS. 17(a) to 17(c) are process diagrams showing the method of manufacturing the electro-optical apparatus substrate of the third embodiment according to the present invention;

FIG. 18 is a configuration view of a projection display that is an example of an electronic apparatus using an electro-optical apparatus having the electro-optical apparatus substrate manufactured by the method of manufacturing the electro-optical apparatus substrate, in the first or second embodiment according to the present invention.

DETAILED DESCRIPTION OF THE PREFERRED EMBODIMENTS

Embodiments according to the present invention will be explained below in detail with reference to the drawings. In the following first to third embodiments, a liquid crystal device of an active matrix type that uses a TFT (as an example of a transistor element) as a switching element is exemplified as an example of an electro-optical apparatus. Also, the features of the first and second embodiments lie in the process of forming a first interlayer insulation film (as an example of an insulation layer) on a surface of an optically transparent substrate, on which a first light shield film (as an example of a light shield layer) has been formed, and the structure of the formation of the first interlayer insulation film (insulation layer).

I. First Embodiment (Structure of Electro-Optical Apparatus)

At first, the structure of the electro-optical apparatus of the first embodiment according to the present invention is described as for a liquid crystal device. The electro-optical apparatus (e.g., a liquid crystal device) in this embodiment has a TFT array substrate (as an example of an electro-optical apparatus substrate) manufactured by the method of manufacturing the electro-optical apparatus substrate in this embodiment.

Also, in this embodiment, the case is described in which a later-described first light shield film (as an example of a light shield layer) is formed only in a formation region of transistor elements (i.e., a pixel portion).

Figure 1:
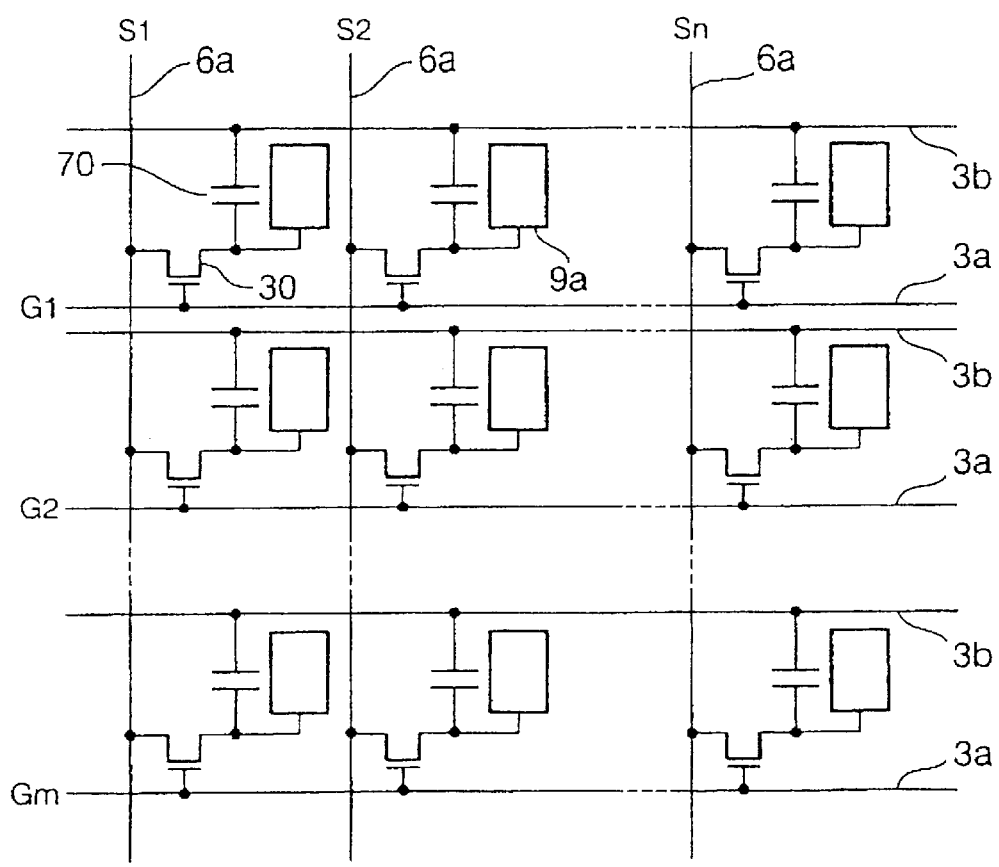
FIG. 1 is an equivalent circuit diagram of various elements, wirings and the like constituting a pixel portion, in an electro-optical apparatus of a first embodiment according to the present invention.
Figure 2:
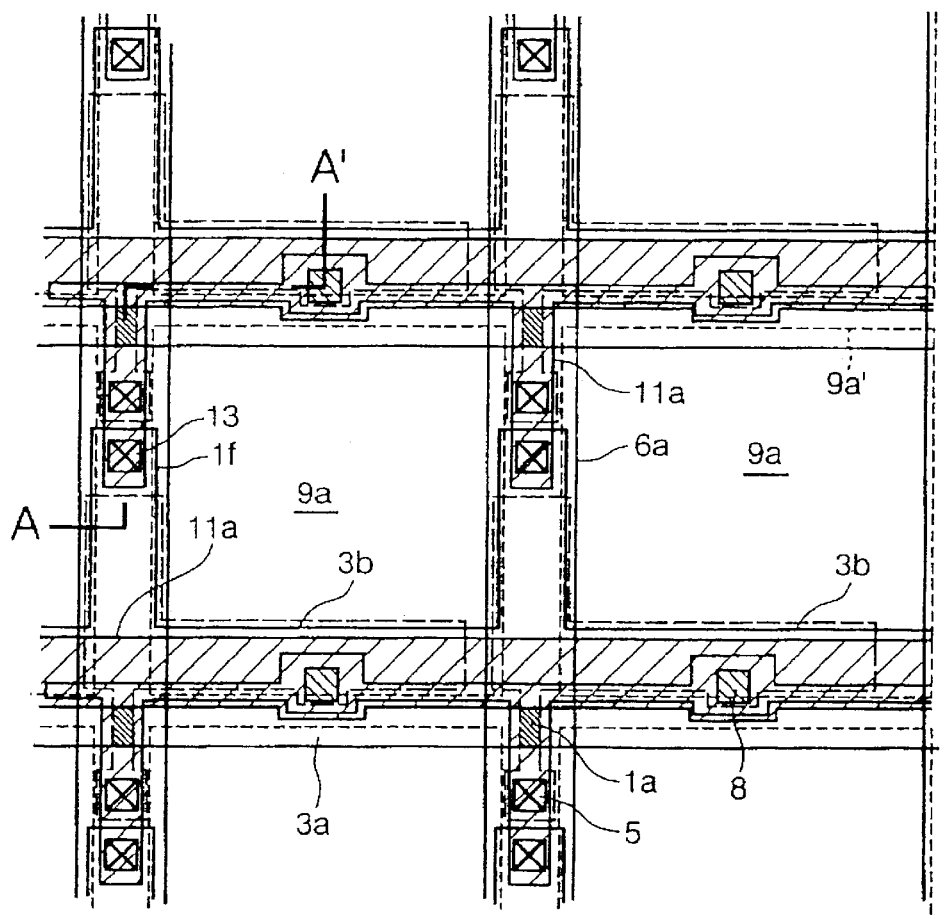
FIG. 2 is a plan view of a plurality of pixel groups adjacent to each other of a TFT array substrate, in the electro-optical apparatus of the first embodiment according to the present invention.

FIG. 1 is an equivalent circuit diagram of various elements, wirings and the like, in a plurality of pixels, which are matrix-shaped and constitute a pixel portion (i.e., a display region) of the liquid crystal device. FIG. 2 is a plan view that enlarges and shows a plurality of pixel groups adjacent to each other of a TFT array substrate in which a data line, a scanning line, a pixel electrode, a light shield film and so forth are formed. FIG. 3 is a sectional view taken on the line A–A' of FIG. 2. In FIG. 1 to FIG. 3, a scale is different for each layer and for each member, in order to indicate each layer and each member at such a size that they can be substantially recognized on the drawing.

In FIG. 1, the plurality of pixels, which are matrix-shaped and constitute the pixel portion of the liquid-crystal device, are provided with: a plurality of pixel electrodes 9a in a form of matrix, and TFTs (transistor elements) 30 for controlling the pixel electrodes 9a. A data line 6a to which a video signal is sent is electrically connected to a source of the TFT 30. Video signals S1, S2, . . . , Sn written to the data lines 6a may be sequentially sent in that order, or may be sent to a plurality of data lines 6a adjacent to each other, for each group. A scanning line 3a is electrically connected to a gate of the TFT 30. This is designed such that scanning signals G1, G2, . . . , Gm are applied to the scanning lines 3a, in a pulse like manner, at a predetermined timing, sequentially in that order.

The pixel electrode 9a is electrically connected to a drain of the TFT 30. By closing the switch of the TFT 30 serving as one example of a switching element only for a certain time period, the video signals S1, S2, . . . , Sn sent from the data lines 6a are written at a predetermined timing. The video signals S1, S2 to Sn of a predetermined level written through the pixel electrodes 9a to the liquid crystal are held for a certain time period between a later-described opposite electrode formed on a later-described opposite substrate and the pixel electrodes 9a.

In the liquid crystal, since an order and an orientation of a molecular set are changed on the basis of an applied voltage level, a light can be modulated to thereby attain a gradation display. A normally white mode disables an input light to be passed through this liquid crystal portion, depending on an applied voltage. A normally black mode enables the input light to be passed through this liquid crystal portion, depending on the applied voltage. A light having a contrast based on a video signal is outputted from the liquid crystal device, as a whole.

Here, in order to prevent a trouble with regard to a display, such as a drop in a contrast ratio, a flicker and the like, from being induced due to the leak of the held video signal, an accumulation capacitor 70 is added in parallel to a capacitance of the liquid crystal generated between the pixel electrode 9*a* and the opposite electrode. For example, a voltage of the pixel electrode 9*a* is held for a time period three digits longer than a time period while a voltage is applied to the data line. Thus, the holding property can be further improved to thereby attain the liquid crystal device having a high contrast ratio. In this embodiment, especially, in order to form such an accumulation capacitor 70, a capacitance line 3*b* whose electrical resistance is reduced is mounted by using the same layer as the scanning line as described later, or a conductive light shield film.

Next, the flat surface structure within the formation region of the transistor elements (i.e., the pixel portion) of the TFT array substrate will be described below in detail with reference to FIG. 2. As shown in FIG. 2, a plurality of transparent pixel electrodes 9*a* (whose contours are represented by dashed line portions 9*a*') are provided in a form of matrix, within the formation region of the transistor elements (i.e., the pixel portion) on the TFT array substrate of the liquid crystal device. The data lines 6*a*, the scanning lines 3*a* and the capacitance lines 3*b* are provided along the respective vertical and horizontal boundaries of the pixel electrodes 9*a*. The data line 6*a* is electrically connected through a contact hole 5 to a later-described source region in a semiconductor layer 1*a* of the single crystal silicon layer. The pixel electrode 9*a* is electrically connected through a contact hole 8 to a later-described drain region in the semiconductor layer 1*a*. Also, the scanning line 3*a* is disposed so as to be opposite to a channel region (which is a region indicated by oblique lines rising to the right) in the semiconductor layer 1*a*. The scanning line 3*a* functions as a gate electrode.

The capacitance line 3*b* has a main line portion substantially straightly extending along the scanning line 3*a* (namely, a first region formed along the scanning line 3*a* when it is flatly viewed) and a protrusion portion protruding to a front stage side (upwardly in FIG. 2) along the data line 6*a* from the crossing portion of the data line 6*a* (namely, a second region extendedly disposed along the data line 6*a* when it is flatly viewed).

A plurality of first light shield films (i.e., light shield layers) 11*a* are disposed in the region represented by oblique lines rising to the right in the figure. Actually, each of the first light shield film 11*a* is disposed at such a position that the TFT containing the channel region of the semiconductor layer 1*a* in the pixel portion is covered when it is viewed from the side of a later-described substrate main body of the TFT array substrate 10. Moreover, it has a main line portion straightly extending along the scanning line 3*a* oppositely to the main line portion of the capacitance line 3*b*, and a protrusion portion protruding to an adjacent stage side (namely, downwardly in FIG. 2) along the data line 6*a* from the crossing portion of the data line 6*a*. A tip of a downward protrusion portion in each stage (each pixel line) of the first light shield films 11*a* overlaps with a tip of an upward protrusion portion of a capacitance line 3*b* in a next stage under the data line 6*a*. A contact hole 13 through which the first light shield film 11*a* and the capacitance line 3*b* are electrically connected to each other is positioned in this overlap portion. That is, in this embodiment, the first light shield film 11*a* is electrically connected through the contact hole 13 to the capacitance line 3*b* at the front stage or the rear stage.

Also, the pixel electrode 9*a*, the TFT and the first light shield film 11*a* are disposed only within the pixel portion, in this embodiment.

Next, the sectional structure within the pixel portion of the liquid crystal device will be described below with reference to FIG. 3. As shown in FIG. 3, a liquid crystal layer 50 is put between a TFT array substrate 10 and an opposite substrate 20 arranged oppositely thereto, in the liquid crystal device.

The TFT array substrate 10 is mainly provided with: a substrate main body 10A constituted by an optically transparent substrate of quartz and the like and; a pixel electrode 9*a*, a TFT 30 (a transistor element) and an orientation film 16 which are formed on the surface of the substrate main body 10A at its side facing the liquid crystal layer 50. The opposite substrate 20 is mainly provided with: a substrate main body 20A constituted by an optically transparent substrate of transparent glass, quartz and the like and; an opposite electrode (a common electrode) 21 and an orientation film 22 which are formed on the surface of the substrate main body 20A at its side facing the liquid crystal layer 50.

The pixel electrodes 9*a* are disposed on the surface of the substrate main body 10A of the TFT array substrate 10, at its side facing the liquid crystal layer 50. The orientation film 16, to which a predetermined orienting process, such as a rubbing process and the like, has been applied, is disposed on the surface of the pixel electrodes 9*a* at its side facing the liquid crystal layer 50. The pixel electrode 9*a* is constituted by a transparent conductive film, for example, such as ITO (Indium Tin Oxide) and the like. The orientation film 16 is constituted by an organic thin film, for example, such as polyimide.

The pixel switching TFT 30 for performing a switching control on each pixel electrode 9*a* is disposed at a position adjacent to each pixel electrode 9*a*, as shown in FIG. 3, on the surface of the substrate main body 10A at its side facing the liquid crystal layer 50.

On the other hand, the opposite electrode (i.e., the common electrode) 21 is disposed on the entire surface of the substrate main body 20A of the opposite substrate 20, at its side facing the liquid crystal layer 50. The orientation film 22, to which the predetermined orienting process, such as the rubbing process and the like, has been applied, is disposed on the surface of the opposite electrode 21 at its side facing the liquid crystal layer 50. The opposite electrode 21 is constituted by a transparent conductive film, for example, such as ITO and the like. The orientation film 22 is constituted by an organic thin film, for example, such as polyimide.

Also, on the surface of the substrate main body 20A at its side facing the liquid crystal layer 50, as shown in FIG. 3, a second light shield film 23 is further disposed in a region except an open region of each pixel portion. Such a configuration of the second light shield film 23 on the side of the orientation substrate 20 can prevent the input light from the opposite substrate 20 from entering a channel region 1*a*' and LDD (Lightly Doped Drain) regions 1*b* and 1*c* of the semiconductor layer 1*a* of the picture switching TFT 30, to thereby improve a contrast.

Between the opposite substrate 20 and the TFT array substrate 10 which are configured as mentioned above such that the pixel electrode 9*a* and the opposite electrode 21 are disposed oppositely to each other, the liquid crystal (as one example of electro-optical material) is sealed in a space surrounded by a seal member (not shown) formed between peripheral edges of both the substrates, so that the liquid crystal layer (electro-optical material layer) 50 is formed.

The liquid crystal layer 50 is constituted by, for example, liquid crystal of one kind or several kinds of nematic liquid crystal which are mixed. A predetermined orientation-state is determined by the orientation films 16 and 22 under the condition that an electric field from the pixel electrode 9a is not applied.

The seal member is constituted by adhesive, for example, such as photo-curing adhesive, thermosetting adhesive and the like, so as to laminate or bond the TFT array substrate 10 and the opposite substrate 20 to each other at their peripheral edges. Spacer constituting of glass fibers, glass beads and the like, may be mixed within the seal member, in order to keep a distance between the two substrates at a predetermined value.

As shown in FIG. 3, the first light shield film (the light shield layer) 11a is disposed at a position corresponding to each pixel switching TFT 30, on the surface of the substrate main body 10A of the TFT array substrate 10, at its side facing the liquid crystal layer 50. The first light shield film 11a is preferably constituted by single metal unit, alloy, metallic silicide and the like, each including at least one of Ti, Cr, W, Ta, Mo and Pd which are opaque metals having high melting points.

Since the first light shield film 11a is constituted by the above-mentioned materials, on the surface of the substrate main body 10A of the TFT array substrate 10, it is possible to protect the first light shield film 11a from being broken or melted by a high temperature process in the process of forming the pixel switching TFT 30, which is carried out after the process of forming the first light shield film 11a.

In this embodiment, the first light shield film 11a is formed in the TFT array substrate 10, as mentioned above. Thus, it is possible to prevent the return light and the like from the TFT array substrate 10 side from being inputted to the channel region 1a' and the LDD regions 1b and 1c of the pixel switching TFT 30, and possible to protect the performance of the pixel switching TFT 30 serving as the transistor element from being deteriorated due to the generation of optical current.

A first interlayer insulation film (insulation layer) 12 is disposed between the first light shield film 11a and the plurality of pixel switching TFTs 30. The first interlayer insulation film 12 is disposed so as to electrically insulate the semiconductor layer 1a constituting the pixel switching TFT 30 from the first light shield film 11a. The first interlayer insulation film 12 is formed on the entire surface of the substrate main body 10A.

The above-mentioned configuration of the first interlayer insulation film 12 on the TFT array substrate 10 also enables the first light shield film 11a from contaminating the pixel switching TFT 30 and the like.

In this embodiment, the first interlayer insulation film 12 is constituted by a first insulation layer and a second insulation layer, which is partially formed on the surface of the first insulation layer and whose polishing rate is lower than that of the first insulation layer The surface of the first interlayer insulation film 12 is smoothed. The inner structure of the first interlayer insulation film 12 will be described in detail when the method of manufacturing the electro-optical apparatus substrate in this embodiment (the method of manufacturing the TFT array substrate 10) is described.

Also, in this embodiment, a gate insulation film 2 is extendedly disposed from a position opposite to the scanning line 3a, and it is used as a dielectric film of the accumulation capacitor 70. The semiconductor layer 1a is extendedly disposed, and it is used as a first accumulation capacitance electrode 1f of the accumulation capacitor 70. Moreover, a part of the capacitance line 3b opposite to them is used as a second accumulation capacitance electrode of the accumulation capacitor 70. In this manner, the accumulation capacitor 70 is constituted.

In detail, a high concentration drain region 1e of the semiconductor layer 1a is extendedly disposed below the data line 6a and the scanning line 3a, and similarly oppositely disposed through the insulation film 2 at the portion of the capacitance line 3b extending along the scanning line 3a and the data line 6a. Accordingly, the first accumulation capacitance electrode (semiconductor layer) 1f is constituted. Especially, the insulation film 2 serving as the dielectric of the accumulation capacitor 70 is no more than the gate insulation film 2 of the TFT 30 formed on the single crystal silicon layer by high temperature oxidation. Thus, it can be a thin insulation film having a high withstand voltage. Hence, the accumulation capacitor 70 can be configured as the accumulation capacitor having a relatively small area and a large capacitance.

Moreover, in the accumulation capacitor 70, as can be seen from FIG. 2 and FIG. 3, it is designed to further provide the accumulation capacitance by oppositely disposing the first light shield film 11a as a third accumulation capacitance electrode through the first interlayer insulation film 12 with respect to the first accumulation capacitance electrode 1f, on the side opposite to the capacitance line 3b serving as the second accumulation capacitance electrode (refer to the accumulation capacitor 70 on the right side of FIG. 3). That is, in this embodiment, the accumulation capacitance is further increased by the establishment of the double accumulation capacitance structure in which the accumulation capacitance is given to both sides facing each other with the first accumulation capacitance electrode 1f between. Such structure can improve the function of protecting the flicker and the burning of a displayed picture, in this liquid crystal device of this embodiment.

As a result, it is possible to effectively use the space beyond the open region such as the region in which the discrination of the liquid crystal is generated along the scanning line 3a and the region below the data line 6a (namely, the region where the capacitance lines 3b are formed), and accordingly possible to increase the accumulation capacitance of the pixel electrode 9a.

In this embodiment, the first light shield film 11a (and the capacitance line 3b electrically connected to it) is electrically connected to a constant potential source. So, the first light shield film 11a and the capacitance line 3b are kept at the constant potential. Thus, the potential variation in the first light shield film 11a has no bad influence on the pixel switching TFT 30 disposed oppositely to the first light shield film 11a. Also, the capacitance line 3b can excellently function as the second accumulation capacitance electrode of the accumulation capacitor 70. As the constant potential source for them, a negative power source sent to a peripheral circuit (for example, a scanning line driving circuit, a data line driving circuit and the like) for driving the liquid crystal device in this embodiment, a constant potential source such as a positive power source and the like, a ground power source, a constant potential source sent to the opposite electrode 21 and the like may be employed. The usage of the power source for the peripheral circuit and the like as mentioned above can cancel out the necessity of disposing a dedicated potential wiring or a dedicated external input terminal, while the first light shield film 11a and the capacitance line 3b can be kept at the constant potential.

As shown in FIG. 2 and FIG. 3, this embodiment is designed such that the first light shield film 11a is electrically connected through the contact hole 13 to the capacitance line 3b at the front or rear stage, in addition to the configuration in which the first light shield film 11a is disposed in the TFT array substrate 10. By adopting such a configuration, the stage difference between (i) the region where the first light shield film 11a and the capacitance line 3b are formed under the overlap with the data line 6a along the edge of the open region of the pixel portion and (ii) another region other than this region is smaller as compared with the case when each first light shield film 11a is electrically connected to a capacitance line of a self-stage. Since the stage difference along the edge of the open region of the pixel portion is smaller as mentioned above, it is possible to suppress the discrination (i.e., the orientation defect) of the liquid crystal caused by the stage difference. Thus, it is possible to make the open region of the pixel portion wider.

The contact hole 13 is made in the protrusion portion of the first light shield film 11a, protruding from the main line portion thereof straightly extending as mentioned above. Here, as for the open position of the contact hole 13, as it is closer to the edge, the occurrence of crack is harder since stress is easily dispersed or due to other reasons. Thus, the stress applied to the first light shield film 11a during the manufacturing process is relaxed depending on the degree to which it approaches the tip of the protrusion portion and the contact hole 13 is made (preferably, depending on the degree to which it approaches the tip almost to the margin). Hence, the crack can be effectively protected to accordingly improve the yield.

Also, the capacitance line 3b and the scanning line 3a are constituted by the same poly-silicon film. The dielectric film of the accumulation capacitor 70 and the gate insulation film 2 of the TFT 30 are constituted by the same high temperature oxide film. And, the first accumulation capacitance electrode if, the channel formation region 1a, the source region 1d and the drain region 1e of the TFT 30 are constituted by the same semiconductor layer 1a. Thus, it is possible to simplify the lamination structure formed on the surface of the substrate main body 10A of the TFT array substrate 10. Moreover, the capacitance line 3b and the scanning line 3a can be formed at the same time by the same thin film forming process, and the gate insulation film 2 and the dielectric film of the accumulation capacitor 70 can be formed at the same time by the same thin film forming process, in the later-described method of manufacturing the liquid crystal device.

Moreover, as shown in FIG. 2, the first light shield films 11a are respectively extended along the scanning lines 3a, and further divided into a plurality of stripes in the direction along the data line 6a. For this reason, the stress caused by the heating and cooling operations during the manufacturing process resulting from the difference between the physical properties of the respective films can be extremely suppressed, in the lamination structure of the liquid crystal device in this embodiment which is composed of the first light shield film 11a, the poly-silicon film constituting the scanning line 3a and the capacitance line 3b, the metallic film constituting the data line 6a, the interlayer insulation film and the like, for example, as compared with the case of the configuration of the grid-shaped light shield film integrally formed around the open region of each pixel portion. Hence, it is possible to protect the crack from being induced in the first light shield film 11a and the like and improve the yield.

By the way, in FIG. 2, the straight main line portion of the first light shield film 11a is formed so as to substantially overlap with the straight main line portion of the capacitance line 3b. However, as long as the first light shield film 11a is disposed at a position to cover the channel region of the TFT 30 and overlaps with the capacitance line 3b at any location so as to form the contact hole 13, the first light shield film 11a can have the function of shielding the light for the TFT 30 and the function of reducing the resistance for the capacitance line. Thus, the first light shield film 11a may be disposed, for example, in the longitudinal gap region along the scanning line 3a between the scanning line 3a and the capacitance line 3b adjacent to each other, or even at the position of slightly overlapping with the scanning line 3a.

The capacitance line 3b and the first light shield film 11a are electrically connected to each other through the contact hole 13 made in the first interlayer insulation film 12 under the sure and high reliable condition. However, such a contact hole 13 may be made for each pixel, or made for each pixel group composed of a plurality of pixels.

If the contact hole 13 is made for each pixel, it is possible to promote the reduction in the resistance of the capacitance line 3b through the first light shield film 11a, and further possible to increase the degree of the redundant structure between them. On the other hand, if the contact hole 13 is made for each pixel group composed of the plurality of pixels (for example, for each two or three pixels), it is possible to maintain the moderate balance between (i) the merit resulting from the redundant structure and the reduction in the resistance of the capacitance line 3b through the first light shield film 11a and (ii) the demerit resulting from the complex manufacturing process or the defect of the liquid crystal device or the like due to the formation of a large number of contact holes 13, in consideration with the sheet resistances of the capacitance line 3b and the first light shield film 11a, the drive frequencies, the required specifications and the like. Thus, this is very advantageous in the actual application.

The contact hole 13 disposed for each pixel or for each pixel group as mentioned above is made below the data line 6a when it is viewed from the side of the opposite substrate 20. Thus, the contact hole 13 is positioned outside the open region of the pixel portion, and further disposed at the portion of the first interlayer insulation film 12 in which the TFT 30 and the first accumulation capacitance electrode 1f are not formed. Hence, it is possible to protect the TFT 30, the other wirings and the like from being deteriorated because of the formation of the contact hole 13, while attaining the effective usage of the pixel portion.

Also, in FIG. 3, the pixel switching TFT 30 has the LDD (Lightly Doped Drain) structure, and it is provided with: the scanning line 3a; the channel region 1a' of the semiconductor layer 1a in which the channel is formed by the electric field from the scanning line 3a; the gate insulation film 2 for insulating between the scanning line 3a and the semiconductor layer 1a; the data line 6a; the low concentration source region (source side LDD region) 1b and the low concentration drain region (drain side LDD region) 1c of the semiconductor layer 1a; and the high concentration source region 1d and the high concentration drain region 1e of the semiconductor layer 1a.

The corresponding pixel electrode 9a among the plurality of pixel electrodes 9a is connected to the high concentration drain region 1e. The source regions 1b and 1d and the drain regions 1c and 1e are formed by doping an N-type or P-type dopant having a predetermined concentration, depending on the formation of an N-type or P-type channel, on the semiconductor layer 1a, as described later. The TFT of the N-type channel has a merit that an operational speed is fast, and it is used in many cases as the pixel switching TFT 30 serving as the switching element of the pixel.

The data line 6a is constituted by the thin film having the light shield property, such as the metallic film of Al and the like, the alloy film of metallic silicide and the like. Also, a second interlayer insulation film 4, in which the contact hole 5 linked to the high concentration source region 1*d* and the contact hole 8 linked to the high concentration drain region 1*e* are respectively formed, is formed on the scanning line 3*a*, the gate insulation film 2 and the first interlayer insulation film 12. The data line 6*a* is electrically connected to the high concentration source region 1*d* through the contact hole 5.

Moreover, a third interlayer insulation film 7, in which the contact hole 8 to the high concentration drain region 1*e* is formed, is formed on the data line 6*a* and the second interlayer insulation film 4. The pixel electrode 9*a* is electrically connected to the high concentration drain region 1*e* through the contact hole 8 to this high concentration drain region 1*e*. The above-mentioned pixel electrode 9*a* is disposed on a top surface of the third interlayer insulation film 7 having the above-mentioned configuration. By the way, the pixel electrode 9*a* and the high concentration drain region 1*e* may be electrically connected to each other via the same Al film as the data line 6*a* or the same poly-silicon film as the scanning line 3*b*.

The pixel switching TFT 30 preferably has the "LDD structure" as mentioned above. However, it may have an "offset structure" in which impurity ions are not implanted into the low concentration source region 1*b* and the low concentration drain region 1*c*, or may be a "self-aligned type TFT" in which the impurity ions are implanted at a high concentration with the gate electrode (scanning line 3*a*) as a mask and then the high concentration source and drain regions are formed in a self-aligned manner.

Also, the single gate structure is used in which only one gate electrode (scanning line 3*a*) of the pixel switching TFT 30 is disposed between the source and drain regions 1*b* and 1*e*. However, two or more gate electrodes may be disposed between them. At this time, it is designed to apply the same signal to each gate electrode. If the TFT is constituted by the double, triple or more gates in this way, the leak current can be avoided at the junction between the channel and each of the source and drain regions, and the current at the off-time can be reduced. If at least one of those double, triple or more gate electrodes has the LDD structure or the offset structure, the current at the off-time can be further reduced to thereby attain the stable switching element.

Here, typically, in the single crystal silicon layer constituting the channel region 1*a*', the low concentration source region 1*b* and the low concentration drain region 1*c* of the semiconductor layer 1*a*, when the light is inputted, the optical current is induced by the photo-electric conversion effect of silicon, and this results in the deterioration in the transistor performance of the pixel switching TFT 30. However, in this embodiment, the data line 6*a* is constituted by the metallic thin film having the light shield property, such as Al and the like, so as to cover the scanning line 3*a* from above. Thus, it is possible to at least prevent the incident light from being inputted to the channel region 1*a*' and the LDD regions 1*b* and 1*c* of the semiconductor layer 1*a*.

As mentioned above, the first light shield film 11*a* is disposed at the lower side of the pixel switching TFT 30 (i.e., at the side of the substrate main body 10A). Thus, it is possible to at least protect the return light from being inputted to the channel region 1*a*' and the LDD regions 1*b*, 1*c* of the semiconductor layer 1*a*.

By the way, in this embodiment, the first light shield film 11*a* and the capacitance line 3*b*, which are disposed for the pixels adjacent to each other at the front or rear stage, are connected to each other. Thus, the capacitance line 3*b* is required in order to send the constant potential to the first light shield film 11*a* for the pixel located at the top stage or the bottom stage. So, as for the number of capacitance lines 3*b*, it is recommended to provide one spare line with respect to the number of vertical pixels.

(Method of Manufacturing Electro-Optical Apparatus)

The method of manufacturing the liquid crystal device having the above-mentioned structure will be described below with reference to FIG. 4 to FIG. 1.

At first, the method of manufacturing the TFT array substrate 10 is described as the method of manufacturing the electro-optical apparatus substrate in this embodiment, on the basis of FIG. 4 to FIG. 11. FIG. 4, FIG. 5 and FIG. 6 to FIG. 11 are indicated by using the scales different from each other.

At first, the steps until the formation of the first light shield film (the light shield layer) 11*a* and the first interlayer insulation film 12 on the substrate main body 10A of the TFT array substrate 10 are described in detail with reference to FIG. 4 and FIG. 5. FIG. 4 and FIG. 5 are the step views showing a part of the TFT array substrate in the respective steps, correspondingly, to the A–A' section of FIG. 2, similarly to FIG. 3.

At first, the substrate body (the optically transparent substrate) 10A, such as quartz substrate, hard glass and the like is prepared. Then, the pre-processes are desired to be carried out so as to suppress the distortion induced in the substrate main body 10A in a high temperature process to be executed later, by performing an annealing process onto the substrate main body 10A, preferably under the atmosphere of inactive gas, such as $N_2$ (nitrogen) and the like, at a high temperature of about 850 to 1300° C., preferably 1000° C. That is, by considering the highest temperature at the process in the manufacturing step, it is desirable to perform a thermal process onto the substrate main body 10A at the temperature equal to or higher than the highest temperature.

The single metal unit, the alloy, the metallic silicide and the like, each including at least one of Ti, Cr, W, Ta, Mo and Pd are deposited on the entire surface of the substrate main body 10A processed as mentioned above, by using a sputtering method, a CVD method, an electronic beam heating depositing method, and the like, as shown in FIG. 4(*a*). Then, they are deposited at a film thickness of, for example, 150 to 200 nm. Accordingly, the light shield layer 11 is formed.

Next, after the photo-resist is formed on the entire surface of the substrate main body 10A, the photo-mask having the pattern (refer to FIG. 2) of the first light shield film 11*a* to be finally formed is used to expose the photo-resist. After that, the photo-resist is developed to then form a photo-resist 207 having the first light shield film 11*a* to be finally formed, as shown in FIG. 4(*b*).

In the present embodiment, since the first light shield film 11*a* is formed in the formation region of the transistor elements (the pixel portion), the photo-resist 207 is formed only within this formation region of the transistor elements.

Then, the light shield layer 11 is etched with the photo-resist 207 as a mask. After that, the strip of the photo-resist 207 enables the first light shield film (the light shield layer) 11*a* having the predetermined pattern (refer to FIG. 2) to be formed only in the formation region of the transistor element (the pixel portion), on the surface of the substrate main body 10A, as shown in FIG. 4(*c*). A film thickness of the first light shield film 11*a* is, for example, 150 to 200 nm.

As shown in FIG. 5(*a*), a first insulation layer 12A is formed on the surface of the substrate main body 10A on which the first light shield film 11*a* has been formed, by the sputtering method, the CVD method and the like. As the material of the first insulation layer 12A, the oxide silicon or the high insulation glass such as NSG (Non-doped Silicon Glass), PSG (Phosphorus Silicate Glass), BSG (Boron Silicate Glass), BPSG (Boron Phosphorus Silicate Glass) and the like. Also, a film thickness of the first insulation layer 12A is set to be at least thicker than that of the first light shield film 11a, and is to, for example, about 400 to 1000 nm, preferably, about 800 nm.

Figure 5A:
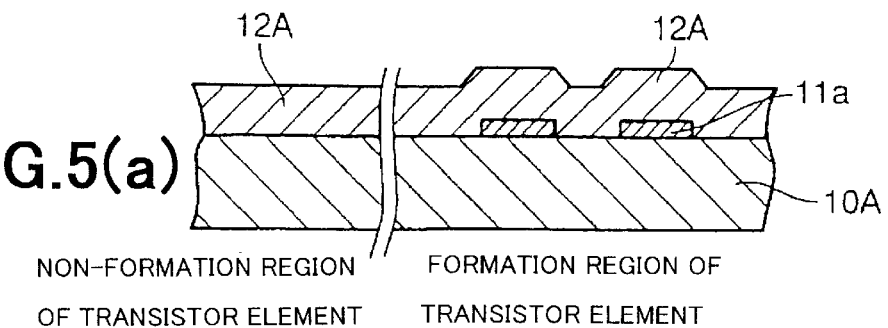
FIGS. 5(a) to 5(c) are process diagrams showing the method of manufacturing the electro-optical apparatus substrate of the first embodiment according to the present invention.
Figure 5B:
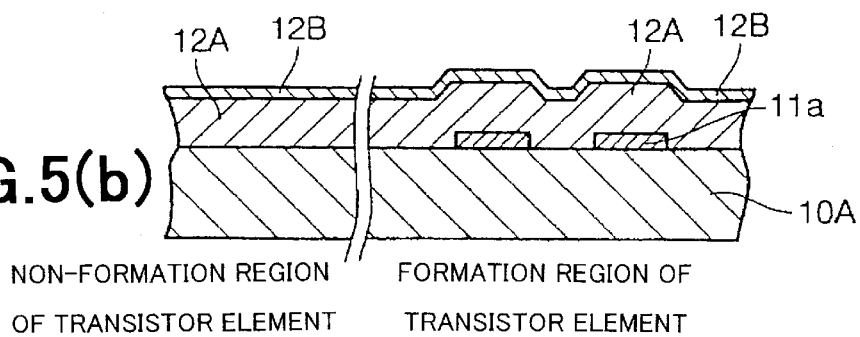

As shown in FIG. 5(b), a second insulation layer 12B whose polishing rate is lower (i.e., harder to be polished) than that of the first insulation layer 12A is formed on the surface of the first insulation layer 12A, by using the sputtering method, the CVD method and the like. If the first insulation layer 12A is made of oxide silicon, nitride silicon can be exemplified as the material of the second insulation layer 12B whose polishing rate is lower than that of the first insulation layer 12A. The polishing rate of the nitride silicon is about ⅓ to ⅕ of the polishing rate of the oxide silicon.

The film thickness of the second insulation layer 12B is determined on the basis of the difference of the polishing rate between the first and second insulation layers 12A and 12B. It is set to be such a thickness that the excessively polishing operation can be substantially suppressed in a later-described polishing step, for example, about 50 to 150 nm.

As shown in FIG. 5(b), the surface of the substrate main body 10A after the formation of the second insulation layer 12B is concave and convex in the formation region of the transistor elements. The non-formation region of the transistor elements is flatly concave.

Next, the surface of the substrate main body 10A on which the second insulation layer 12B is formed is polished by using a method such as a CMP (Chemically Mechanically polishing) method and the like.

In this step, the convex portion is formed only in the formation region of the transistor elements. Thus, in the formation region of the transistor elements, the polishing rate is low, and the polishing speed is slow. However, the second insulation layer 12B on the convex surface is polished. After the removal of the second insulation layer 12B on the convex surface, the convex portion is constituted by the first insulation layer 12A whose polishing rate is low. Thus, the polished degree of the convex portion is progressed in this region. At this time, the concave surface is constituted by the second insulation layer 12B whose polishing rate is lower than that of the convex portion. Hence, it is possible to protect the concave surface from being polished, and accordingly possible to polish only the convex portion.

Figure 5C:
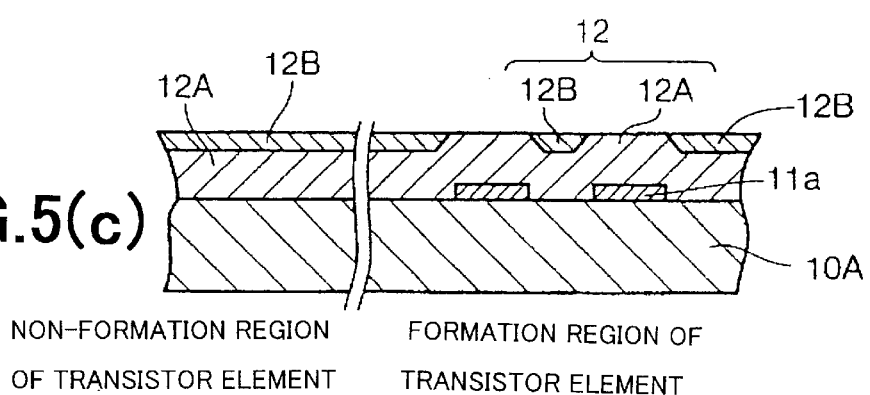

When the convex portions are reduced and the polished depth reaches the heights of the second insulation layers 12B on the concave surfaces in the formation region and the non-formation region of the transistor elements, an area occupied by the second insulation layer 12B whose polishing rate is low is increased, and the polishing speed is dropped, on the surface of the substrate main body 10A, as shown in FIG. 5(c). Thus, the stop of the polishing operation at this time enables the formation of the first interlayer insulation film (insulation layer) 12, whose surface is smoothed and which is composed of the first insulation layer 12A and the second insulation layer 12B that is partially formed on the surface of the first insulation layer 12A and has the polishing rate lower than that of the first insulation layer 12A.

By the way, in this step, the second insulation layers 12B on the concave surfaces in the formation region and the non-formation region of the transistor elements may not be polished at all, or may be slightly polished and accordingly thinned. The polishing operation is at least done such that the first insulation layers 12A are not exposed on the concave surfaces in the formation region and the non-formation region of the transistor elements.

The method of manufacturing the TFT array substrate 10 from the substrate main body 10A on which the first interlayer insulation film 12 having the smoothed surface has been formed will be described below with reference to FIG. 6 to FIG. 11. FIG. 6 to FIG. 11 are the step views showing a part of the TFT array substrate in the respective steps, correspondingly to the A–A' section of FIG. 2, similarly to FIG. 3.

Also, FIG. 6(a) is the view showing a part of FIG. 5(c) at a different scale. Also, in FIG. 6 to FIG. 11, the illustrations of the first and second insulation layers 12A, 12B constituting the first interlayer insulation film 12 are omitted for the simplicity.

As shown in FIG. 6(b), a single crystal silicon substrate 206a and the substrate main body 10A on which the first interlayer insulation film (insulation layer) 12 having the smoothed surface has been formed as shown in FIG. 6(a) are laminated.

A thickness of the single crystal silicon substrate 206a used for the lamination is, for example, 600 μm. In advance, an oxide film layer 206b is formed on the surface of the single crystal silicon substrate 206a at its side facing the substrate main body 10A are laminated, and hydrogen ions (H+) are implanted, for example, at an acceleration voltage of 100 keV and a dose amount of $10 \times 10^{16}/cm^2$. The oxide film layer 206b is formed by oxidizing the surface of the single crystal silicon substrate 206a at about 0.05 to 0.8 μm.

The laminating step may employ a method of directly laminating two substrates, for example, by carrying out a thermal process at 300° C. for two hours. Also, in order to further increase the lamination strength, it is necessary to further increase the temperature of the thermal process to about 450° C. However, there is a large difference of a thermal expansion coefficient between the single crystal silicon substrate 206a and the substrate main body 10A made of quartz and the like. Thus, if it is heated at it is, the defects such as crack and the like may be brought about in the single crystal silicon layer, which may result in the fear of deterioration in a quality of the TFT array substrate 10 to be manufactured.

In order to suppress the occurrence of the above-mentioned defects such as the crack and the like, it is desirable to reduce the thickness of the single crystal silicon substrate 206a, to which the thermal process for the lamination has been once applied at 300° C., to about 100 to 150 μm, by a wet etching or CMP operation, and then carry out the thermal process at a higher temperature. For example, it is desirable to use KOH aqueous solution of 80° C. to carry out an etching operation so that the thickness of the single crystal silicon substrate 206a becomes 150 μm, and then laminate the single crystal silicon substrate 206a and the substrate main body 10A, and again carry out the further thermal process at 450° C., to thereby increase the lamination strength.

As shown in FIG. 6(c), a thermal process is carried out for stripping the single crystal silicon substrate 206a from the substrate main body 10A while leaving the single crystal silicon layer 206 and the oxide film 206b on the lamination side of the laminated single crystal silicon substrate 206a. This strip phenomenon of the substrate is induced since the bonding of the silicon in the layer near the surface of the single crystal silicon substrate 206a is divided because of the hydrogen ion implanted into the single crystal silicon substrate 206a.

The thermal process can be done, for example, by heating the two laminated substrates to 600° C. at a temperature rise speed of 20° C. per minute. This thermal process enables the laminated single crystal silicon substrate 206a to be separated from the substrate main body 10A. Accordingly, the single crystal silicon layer 206 of about 200 nm±5 nm is formed on the surface of the substrate main body 10A. The single crystal silicon layer 206 can be formed at any film thickness of 50 nm to 3000 nm by changing the acceleration voltage for the hydrogen ion implantation applied to the single crystal silicon substrate 206a as mentioned above.

In addition, the single crystal silicon layer 206 whose film thickness is reduced may be obtained by a method other than the above-mentioned method. Namely, it may be obtained by a method of polishing a surface of a single crystal silicon substrate to reduce its film thickness to 3 to 5 μm, and further etching its film thickness to about 0.05 to 0.8 μm by means of a PACE (Plasma Assisted Chemical Etching) method and finishing it, or it may be obtained by an ELTRAN (Epitaxial Layer Transfer) method for transferring an epitaxial silicon layer formed on cellular silicon onto a lamination substrate by a selective etching of cellular silicon layer.

Next, as shown in FIG. 6(d), the semiconductor layer 1a having the predetermined pattern as shown in FIG. 2 is formed by a photo-lithography step, an etching step and the like. That is, especially, the first accumulation capacitance electrode 1f extended from the semiconductor layer 1a constituting the pixel switching TFT 30 is formed in the region where the capacitance line 3b is formed along the scanning line 3a and the region where the capacitance line 3b is formed below the data line 6a.

As shown in FIG. 6(e), the first accumulation capacitance electrode 1f together with the semiconductor layer 1a constituting the pixel switching TFT 30 is thermally oxidized at a temperature of about 850 to 1300° C., preferably, at a temperature of about 1000° C., for about 72 minutes. Accordingly, a thermally oxidized silicon film is formed which has a relatively thin thickness of about 60 nm, and the gate insulation film 2 for the capacitance formation is formed together with the gate insulation film 2 of the pixel switching TFT 30. Consequently, the thickness of the semiconductor layer 1a and the first accumulation capacitance electrode 1f is a thickness of about 30 to 170 nm, and a thickness of the gate insulation film 2 is a thickness of about 60 nm.

Figure 7A:
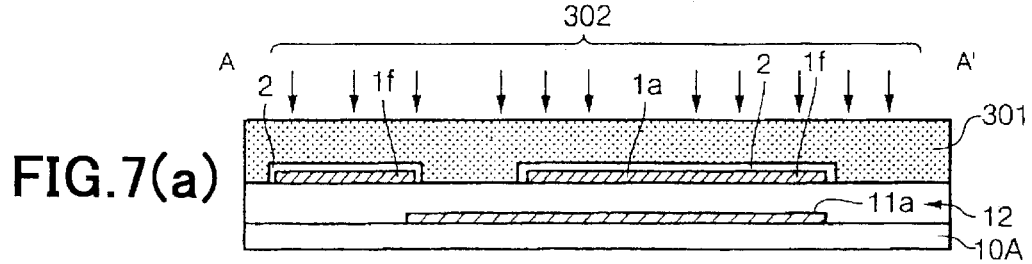
FIGS. 7(a) to 7(d) are process diagrams showing the method of manufacturing the electro-optical apparatus substrate of the first embodiment according to the present invention.

As shown in FIG. 7(a), a resist film 301 is formed at the area corresponding to the semiconductor layer 1a of the N-channel type, and dopant 302 of the V-group element, such as P and the like, is doped on the semiconductor layer 1a of P-channel type at a low concentration (for example, P ions at an acceleration voltage of 70 keV and at a dose amount of $2\times10^{11}/cm^2$).

Figure 7B:
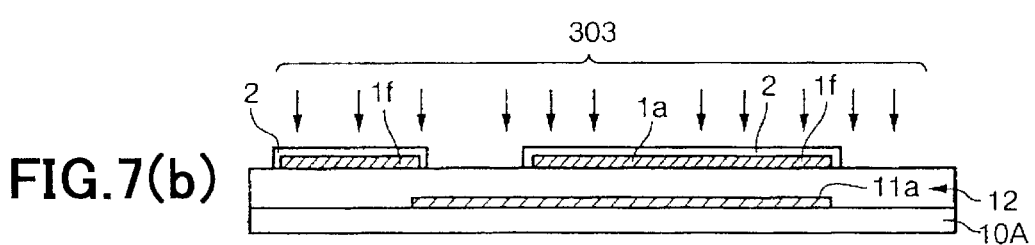

As shown in FIG. 7(b), a resist film is formed at the area corresponding to the semiconductor layer 1a of the P-channel type (not shown), and dopant 303 of the III-group element, such as B and the like, is doped on the semiconductor layer 1a of the N-channel type at a low concentration (for example, B ions at an acceleration voltage of 35 keV and at a dose amount of $1\times10^{12}/cm^2$).

Figure 7C:
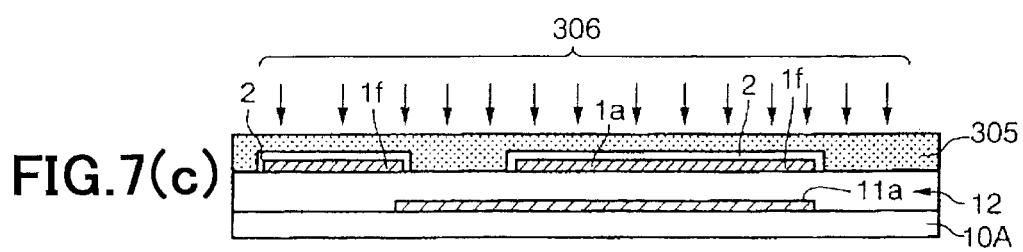

As shown in FIG. 7(c), a resist film 305 is formed on the surface of the substrate 10 except the end of the channel region 1a' of each semiconductor layer 1a for each of the P channel and the N channel. Then, as for the P-channel, dopant 306 of the V-group element, such as P and the like, is doped at a dose amount equal to about one to ten times that of the step shown in FIG. 7(a). As for the N-channel, a dopant 306 of the III-group element, such as B and the like, is doped at a dose amount equal to about one to ten times that of the step shown in FIG. 7(b).

Figure 7D:
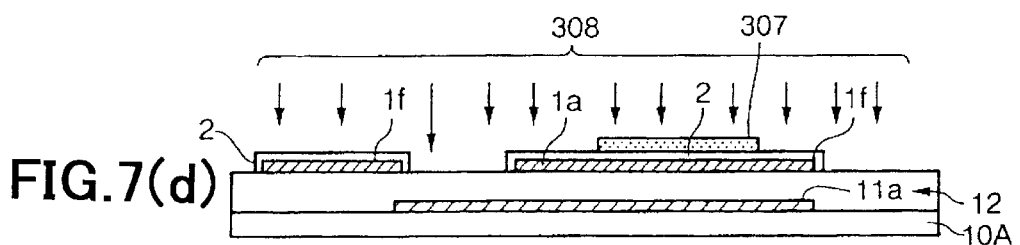

As shown in FIG. 7(d), in order to reduce the resistance of the, first accumulation capacitance electrode if constituted by the extension of the semiconductor layer 1a, a resist film 307 (whose width is wider than that of the scanning line 3a) is formed in a portion corresponding to the scanning line 3a (gate electrode) on the surface of the substrate main body 10A. Then, with it as a mask, dopant 308 of the V-group element, such as P and the like, is doped from above it, at a low concentration (for example, P ions at an acceleration voltage of 70 keV and at a dose amount of $3\times10^{14}/cm^2$).

Next, as shown in FIG. 8(a), the contact hole 13 linked to the first light shield film 11a is formed in the first interlayer insulation film 12 by using a dry etching, such as a reactive etching, a reactive ion beam etching or the like, or a wet etching. At this time, the method of making the contact hole 13 and the like by the anisotropy etching, such as the reactive etching or the reactive ion beam etching provides the merit that the shape of the open hole can be made substantially equal to that of the mask. However, if their holes are made by using the combination of the dry etching and the wet etching, the contact hole 13 and the like can be tapered, which provides the merit of protecting the wiring from being disconnected at a time of the wiring connection.

As shown in FIG. 8(b), after a poly-silicon layer 3 is deposited at a thickness of about 350 nm by a decompression CVD method and the like, phosphorus (P) is thermally diffused to make a poly-silicon film 3 conductive. Or, doped silicon film into which the P ions are implanted simultaneously with the film formation of the poly-silicon film 3 may be used to accordingly improve the conductive property of the poly-silicon layer 3.

As shown in FIG. 8(c), the capacitance line 3b is formed together with the scanning line 3a having the predetermined pattern shown in FIG. 2, by the photo-lithography step using the resist mask, the etching step and the like. After that, the poly-silicon remaining on the rear of the substrate main body 10A is etched and removed by covering the surface of the substrate main body 10A with resist film.

As shown in FIG. 8(d), in order to form the LDD region of the P-channel in the semiconductor layer 1a, the area corresponding to the semiconductor layer 1a of the N-channel is covered with a resist film 309. Then, with the scanning line 3a (gate electrode) as a diffusion mask, dopant 310 of the III-group element, such as B and the like, is firstly doped at a low concentration (for example, $BF_2$ ions at an acceleration voltage of 90 keV and at a dose amount of $3\times10^{13}/cm^2$). Accordingly, the low concentration source region 1b and the low concentration drain region 1c for the P-channel are formed.

In succession, as shown in FIG. 8(e), in order to form the high concentration source region Id and the high concentration drain region 1e for the P-channel in the semiconductor layer 1a, in the condition that the area corresponding to the semiconductor layer 1a of the N-channel is covered with the resist film 309 and in the condition that, although it is not shown, a resist layer is formed on the scanning line 3a corresponding to the P-channel with a mask having a width wider than that of the scanning line 3a, dopant 311 of the III-group element, such as B and the like, is similarly doped at a high concentration (for example, $BF_2$ ions at an acceleration voltage of 90 keV and at a dose amount of $2\times10^{15}/cm^2$).

Next, as shown in FIG. 9(a), in order to form the LDD region of the N-channel in the semiconductor layer 1a, the area corresponding to the semiconductor layer 1a of the P-channel is covered with resist film (not shown). Then, with the scanning line 3a (gate electrode) as a diffusion mask, dopant 60 of the V-group element, such as P and the like, is doped at a low concentration (for example, P ions at an acceleration voltage of 70 keV and at a dose amount of $6 \times 10^{12}/cm^2$). Accordingly, the low concentration source region 1b and the low concentration drain region 1c for the N-channel are formed.

In succession, as shown in FIG. 9(b), in order to form the high concentration source region. 1d and the high concentration drain region 1e for the N-channel in the semiconductor layer 1a, after a resist 62 is formed on the scanning line 3a corresponding to the N-channel with a mask having a width wider than that of the scanning line 3a, dopant 61 of the V-group element, such as P and the like, is similarly doped at a high concentration (for example, P ions at an acceleration voltage of 70 keV and at a dose amount of $4 \times 10^{15}/cm^2$).

Next, as shown in FIG. 9(c), so as to cover the capacitance line 3b and the scanning line 3a together with the scanning line 3a in the pixel switching TFT 30, for example, a normal pressure or decompression CVD method, TEOS gas and the like are used to form the second interlayer insulation film 4 composed of silicate glass film, such as NSG, PSG, BSG, BPSG and the like, nitride silicon film, oxide silicon film and the like. A film thickness of the second interlayer insulation film 4 is desired to be about 500 to 1500 nm, and further desired to be 800 nm.

After that, the annealing process at about 850° C. for about 20 minutes is carried out in order to activate the high concentration source region 1d and the high concentration drain region 1e.

As shown in FIG. 9(d), the contact hole 5 to the data line 31 is formed by the dry etching, such as the reactive etching, the reactive ion beam etching and the like, or the wet etching. Also, contact holes through which the scanning line 3a and the capacitance line 3b are connected to wirings (not shown) are made in the second interlayer insulation film 4, by the same step as the contact hole 5.

Figure 10A:
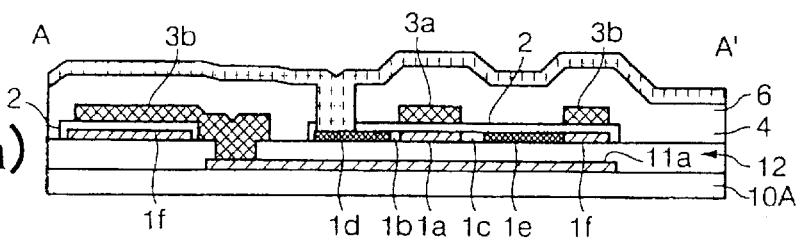
FIGS. 10(a) to 10(c) are process diagrams showing the method of manufacturing the electro-optical apparatus substrate of the first embodiment according to the present invention.
Figure 10B:
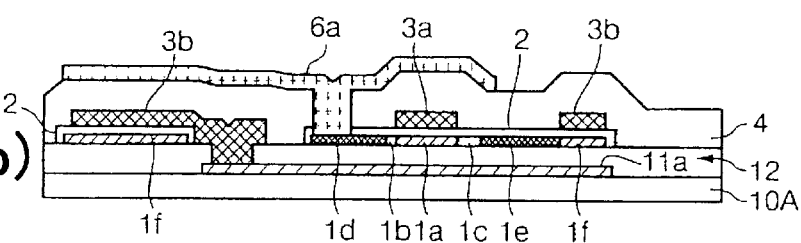

Next, as shown in FIG. 10(a), a low resistive metal having a light shield property, such as Al and the like, metallic silicide and the like are deposited as a metallic film 6, at a thickness of about 100 to 700 nm, preferably, about 350 nm, on the second interlayer insulation film 4 by using the sputtering process and the like. Moreover, as shown in FIG. 10(b), the data line 6a is formed by using the photo-lithography step, the etching step and the like.

Figure 10C:
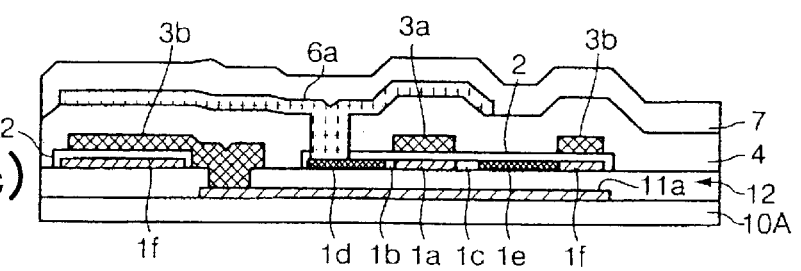

As shown in FIG. 10(c), so as to cover the data line 6a, for example, the normal pressure or decompression CVD method, the TEOS gas and the like are used to form a third interlayer insulation film 7 composed of the silicate glass film, such as NSG, PSG, BSG, BPSG and the like, the nitride silicon film, the oxide silicon film and the like. A film thickness of the third interlayer insulation film 4 is desired to be about 500 to 1500 nm, and further desired to be 800 nm.

Figure 11A:
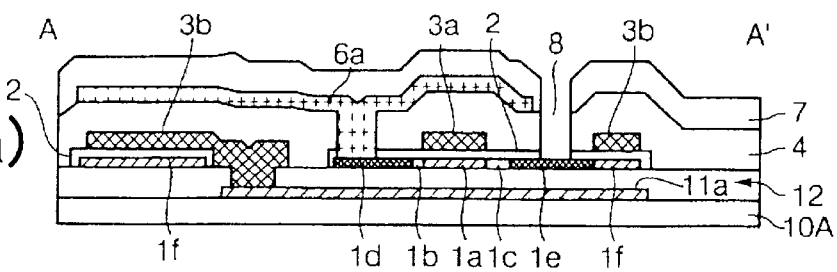
FIGS. 11(a) to 11(c) are process diagrams showing the method of manufacturing the electro-optical apparatus substrate of the first embodiment according to the present invention.

Next, as shown in FIG. 11(a), the contact hole 8 through which the pixel electrode 9a and the high concentration drain region 1e are electrically connected to each other in the pixel switching TFT 30 is formed by using the dry etching such as the reactive etching, the reactive ion beam etching and the like.

Figure 11B:
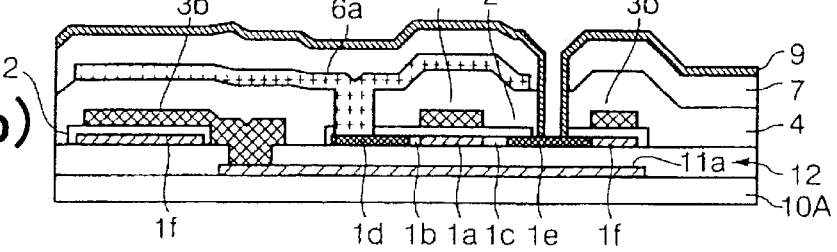
Figure 11C:
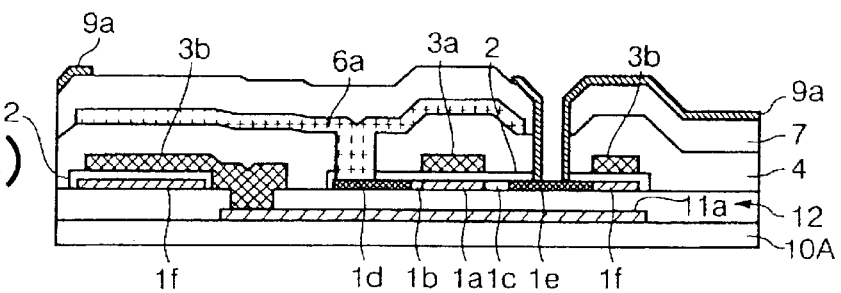

As shown in FIG. 11(b), a transparent conductive thing film 9, such as ITO and the like, is deposited at a thickness of about 50 to 200 nm on the third interlayer insulation film 7, by using the sputtering process and the like. Moreover, as shown in FIG. 11(c), the pixel electrode 9a is formed by using the photo-lithography step, the etching step and the like. If the liquid crystal device in this embodiment is a reflective type liquid crystal device, the pixel electrode 9a may be made of opaque material having a high reflectance, such as Al and the like.

In succession, after the coating solution for the orientation film of poly-imide system is coated on the pixel electrode 9a, the rubbing process is carried out in a predetermined direction so as to provide a predetermined pre-tilt angle. Accordingly, the orientation film 16 is formed (refer to FIG. 3).

The TFT array substrate (electro-optical apparatus substrate) 10 is manufactured as mentioned above.

According to the method of manufacturing the electro-optical apparatus substrate in this embodiment, the first light shield film (the light shield layer) 11a is formed only in the formation region of the transistor elements (the pixel portion), on the surface of the substrate main body (the optically transparent substrate) 10A. Then, the first insulation layer 12A and the second insulation layer 12B whose polishing rate is lower than that of the first insulation layer 12A are sequentially laminated on the surface of the substrate main body 10A on which the first light shield film 11a has been formed. After that, the surface of the substrate main body 10A is polished to thereby enable the formation of the first interlayer insulation film (insulation layer) 12 whose surface is smoothed. Thus, the void is hardly induced in the lamination boundary between the first interlayer insulation film (insulation layer) 12 and the single crystal silicon layer 206. Hence, it is possible to prevent the performance of the TFT (transistor element) 30 from being deteriorated.

Also, the lamination strength between the first interlayer insulation film 12 and the single crystal silicon layer 206 can be reserved to thereby prevent the defects such as the film strip and the like from being induced in the step of forming the TFT (transistor element) 30. Accordingly, the yield of the product can be improved.

The method of manufacturing the opposite substrate 20 and the method of manufacturing the liquid crystal device from the TFT array substrate 10 and the opposite substrate 20 will be described below.

As for the opposite substrate 20 shown in FIG. 3, the optically transparent substrate such as the glass substrate and the like is prepared as the substrate main body 20A. Then, a second light shield film 23 and a second light shield film serving as a later-described peripheral division is formed on the surface of the substrate main body 20A. The second light shield film 23 and the second light shield film serving as the later-described peripheral division are formed through the photo-lithography step and the etching step, after sputtering metallic material such as Cr, Ni, Al and the like, for example. Those second light shield films may be made of material, such as resin black in which carbon, Ti and the like are dispersed in the photo resist, and the like, in addition to the above-mentioned metallic material.

After that, the transparent conductive thin film such as ITO and the like is deposited at a thickness of about 50 to 200 nm on the entire surface of the substrate main body 20A, by using the sputtering method and the like. Accordingly, the opposite electrode 21 is formed. Moreover, after the coating solution for the orientation film of polyimide and the like is coated on the entire surface of the opposite electrode 21, the orientation film 22 (refer to FIG. 3) is formed by performing the rubbing process in the predetermined direction so as to provide the predetermined pre-tilt angle. The opposite substrate 20 is formed as mentioned above.

Finally, the opposite substrate 20 and the TFT array substrate 10 manufactured as mentioned above are laminated or bonded via the sealing member in such a state that the orientation films 16 and 22 are opposite to each other. Then, the liquid crystal constituted, for example, by mixing a plurality of kinds of nematic liquid crystals, is sucked into the space between those two substrates, by using a vacuum sucking method and the like. So, the liquid crystal layer 50 having a predetermined thickness is formed to accordingly manufacture the liquid crystal device having the above-mentioned structure.

(Entire Configuration of Liquid Crystal Device)

Figure 12:
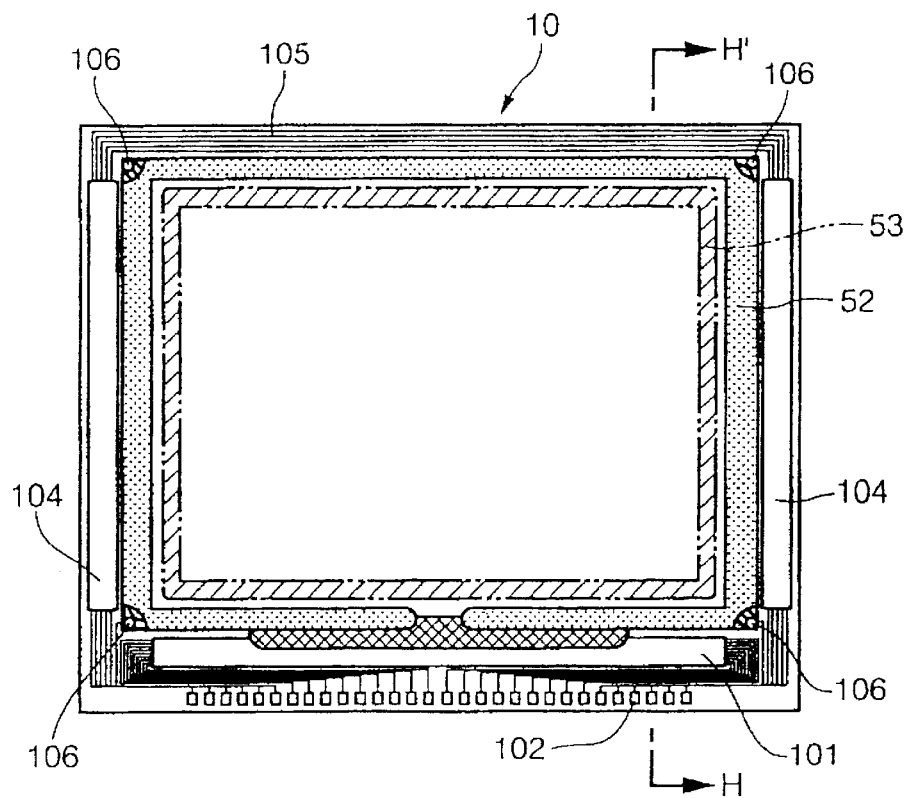
FIG. 12 is a plan view when a TFT array substrate of the electro-optical apparatus having the electro-optical apparatus substrate manufactured by using the method of manufacturing the electro-optical apparatus substrate of the first embodiment according to the present invention is viewed from an opposite substrate side together with respective components.
Figure 13:
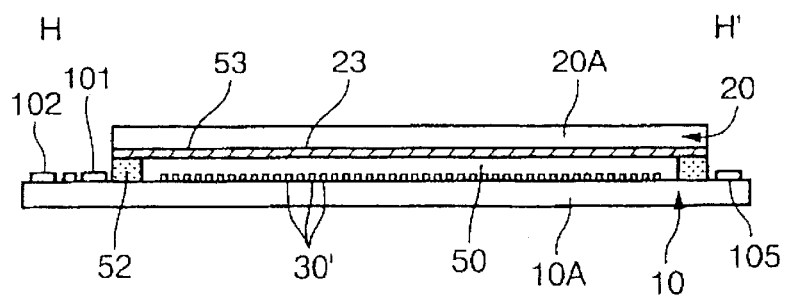
FIG. 13 is a sectional view taken on the line H–H' of FIG. 12.

The entire configuration of the liquid crystal device in this embodiment having the above-mentioned configuration will be described below with reference to FIG. 12 and FIG. 13. FIG. 12 is a plan view when the TFT array substrate 10 is viewed from the side of the opposite substrate 20, and FIG. 13 is a sectional view taken on the line H–H' of FIG. 12, including the opposite substrate 20.

In FIG. 12, a sealing member 52 is disposed along the edge on the surface of the TFT array substrate 10. As shown in FIG. 13, the opposite substrate 20 having the contour substantially equal to that of the sealing member 52 shown in FIG. 12 is adhered through the sealing member 52 to the TFT array substrate 10.

As shown in FIG. 12, a second light shield film 53 serving as the peripheral division made of the material same as the second light shield film 23 is disposed in parallel to the inside peripheral of the sealing member 52, on the surface of the opposite substrate 20. The second light shield film 53 may be made of material different from that of the second light shield film 23.

In the TFT array substrate 10, a data line driving circuit 101 and a mount terminal 102 are mounted along one side of the TFT array substrate 10, in a region outside the sealing member 52. A scanning line driving circuit 104 is mounted along two sides adjacent to the above-mentioned one side. If a delay of a scanning signal sent to the scanning line 3a does not have any bad influence, it is naturally allowable to mount the scanning line driving circuit 104 on only one side.

Also, the data line driving circuits 101 may be mounted on both the sides along the sides of the display region (pixel portion). For example, the data lines 6a of odd-numbered rows may be designed so as to send a video signal from the data line driving circuits mounted along one side of the display region, and the data lines 6a on even-numbered rows are designed so as to send a video signal from the data line driving circuits mounted along the other side of the display region. If the data lines 6a are driven in the comb-teeth manner as mentioned above, the area occupied by the data line driving circuits can be expanded to thereby design a complex circuit.

Moreover, a plurality of wirings 105 for the connection between the scanning line driving circuits 104 mounted on both the sides of the display region are mounted on the remaining one side of the TFT array substrate 10. Moreover, a pre-charging circuit may be hiddenly mounted below the second light shield film 53 serving as the peripheral division. Also, a conductive material 106 for providing the electrical conductivity between the TFT array substrate 10 and the opposite substrate 20 is mounted in at least one portion in a corner between the TFT array substrate 10 and the opposite substrate 20.

An inspection circuit for inspecting the quality, the defect and the like of the liquid crystal device during the manufacturing process or in the shipment and the like may be further formed on the surface of the TFT array substrate 10. Instead of mounting the data line driving circuit 101 and the scanning line driving circuit 104 on the surface of the TFT array substrate 10, for example, they may be electrically and mechanically connected through an anisotropy conductive film disposed in the peripheral region of the TFT array substrate 10, as a driving LSI mounted on TAB (Tape Automated Bonding Substrate).

A polarization film, a phase difference film, a polarization unit and the like are disposed in predetermined directions, on the opposite substrate 20 at its side to which the light of the opposite substrate 20 is inputted, and on the TFT array substrate 10 at its side from which the light is outputted, on the basis of an operational mode, such as a TN (Twisted Nematic) mode, an STN (Super TN) mode, a D-STN (Dual Scan-STN) mode and the like, or a normally white mode/normally black mode.

If the liquid crystal device in this embodiment is applied to a color liquid crystal projector (as one example of a projection type display device), three liquid crystal devices are used as light valves for RGB respectively. The lights of respective colors decomposed through a dichroic mirror for decomposing the respective RGB colors are respectively inputted as projection lights to respective panels. Thus, in this case, a color filter is not disposed in the opposite substrate 20, as described in the above-mentioned embodiment.

However, on the surface of the substrate main body 20A in the opposite substrate 20 at its side facing the liquid crystal layer 50, the RGB color filter together with its protection film may be formed in a predetermined region opposite to the pixel electrode 9a where the second light shield film 23 is not formed. Such configuration enables the liquid crystal device in the above-mentioned embodiment to be applied to a color liquid crystal device, such as a direct view type or a reflection type of a color liquid crystal television other than the liquid crystal projector.

Moreover, micro lenses may be constituted on the surface of the opposite substrate 20 so as to correspond to the pixels in a one-to-one relationship. By employing such a constitution, the light collection efficiency of the incident lights can be improved to thereby attain the bright liquid crystal device. Furthermore, several interference layers whose refractive indexes are different from each other may be deposited on the surface of the opposite substrate 20, so that a dichroic filter for making the RGB colors by virtue of the interference of the light may be constructed. This opposite substrate with the dichroic filter can attain the brighter color liquid crystal device.

By the way, the liquid crystal device in this embodiment is designed so as to input the incident light from the side of the opposite substrate 20, similarly to the conventional technique. However, since it is configured to have the first light shield film 11a in the TFT array substrate 10, it may be designed to input the incident light from the side of the TFT array substrate 10 and then output the light from the side of the opposite substrate 20. That is, even if the liquid crystal device is installed in the liquid crystal projector in this way, it is possible to protect the light from being inputted to the channel region 1a' and the LDD regions 1b and 1c of the semiconductor layer 1a, to thereby display a picture of a high quality.

Conventionally, in order to protect the reflection on the rear side of the TFT array substrate 10, it is necessary to separately mount a polarization device, on which an AR (Anti-Reflection) film for the reflection protection is coated, or to stick the AR film. However, in this embodiment, the first light shield film 11*a* is at least formed between the surface of the TFT array substrate 10 and the channel region 1*a*' and the LDD regions 1*b* and 1*c* of the semiconductor layer 1*a*. Thus, it is not necessary to use the AR-coated polarization device or the AR-film, or to use such a substrate that the AR process is applied onto the TFT array substrate 10 itself.

Thus, according to the above-mentioned embodiment, the cost of the materials can be reduced, and the yield is not dropped because of dust, flaw, and the like when the polarization unit is stuck. Thus, this is very advantageous. Also, the light resistance property is excellent. So, even if a bright light source is used or a polarization beam splitter is used to carry out a polarization conversion in order to improve a light usage efficiency, the deterioration in the picture quality such as cross talk caused by the light and the like is hardly brought about.

Also, the liquid crystal device in this embodiment has the TFT array substrate (the electro-optical apparatus substrate) 10 manufactured by the method of manufacturing the electro-optical apparatus substrate in this embodiment. Thus, there is no or little void on the lamination boundary between the first interlayer insulation film (insulation layer) 12 and the single crystal silicon layer 206. The lamination strength between the first interlayer insulation film (insulation layer) 12 and the single crystal silicon layer 206 is strong. So, the variation and the defect are hardly induced in the property of the TFT (transistor element) 30. Hence, this is superior in performance.

II. Second Embodiment
(Method of Manufacturing Electro-Optical Apparatus Substrate)

A method of manufacturing a TFT array substrate will be described below as a method of manufacturing an electro-optical apparatus substrate as a second embodiment according to the present invention.

The differences between the method of manufacturing the electro-optical apparatus substrate in this embodiment and the method of manufacturing the electro-optical apparatus substrate in the first embodiment are only a formation region of a first light shield film and a method of manufacturing a first interlayer insulation film.

Figure 14A:
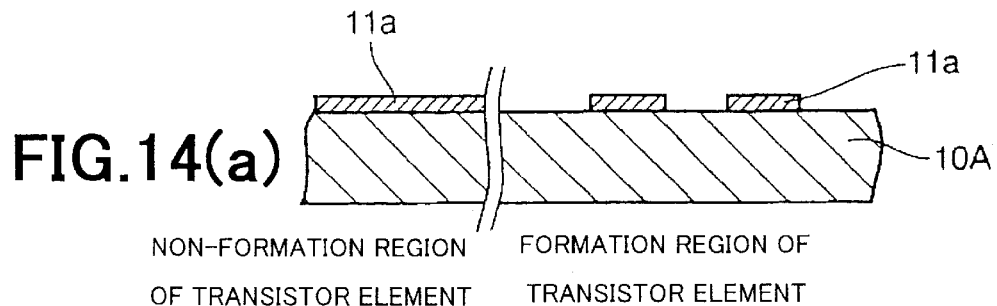
FIGS. 14(a) to 14(c) are process diagrams showing a method of manufacturing an electro-optical apparatus substrate of a second embodiment according to the present invention.
Figure 14B:
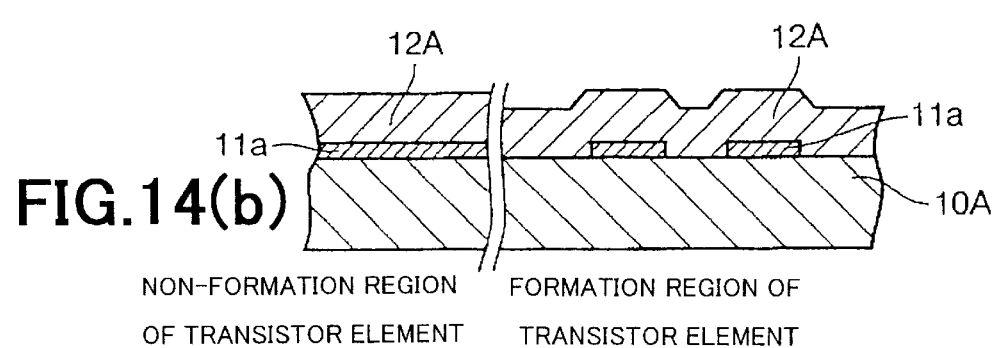
Figure 14C:
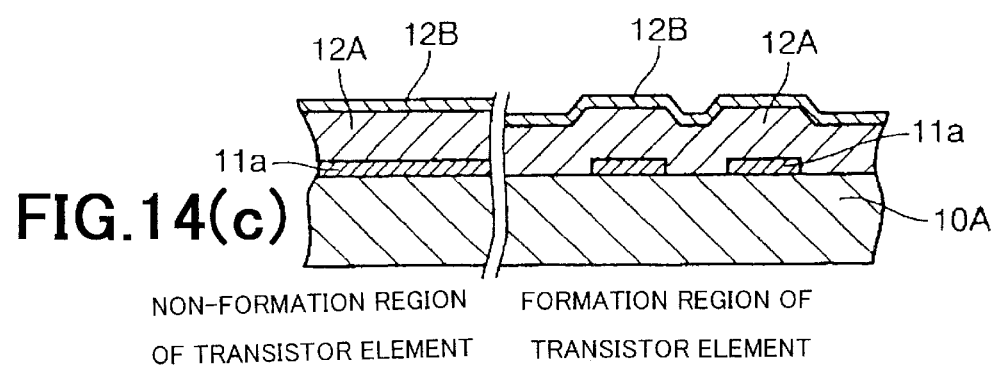
Figure 15A:
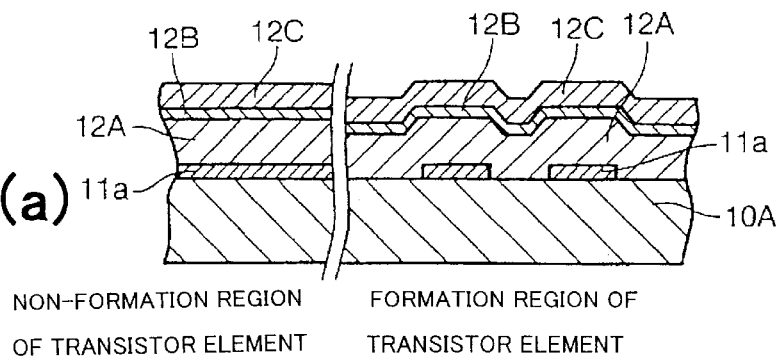
FIGS. 15(a) and 15(b) are process diagrams showing the method of manufacturing the electro-optical apparatus substrate of the second embodiment according to the present invention.

Thus, only the steps until the formation of the first interlayer insulation film on the surface of the substrate body of the TFT array substrate are described with reference to FIG. 14 and FIG. 15. FIG. 14 and FIG. 15 are the views corresponding to FIG. 4 and FIG. 5 in the first embodiment. The manufacturing steps on and after FIG. 15, namely, the steps after the formation of the first interlayer insulation film are same as those shown in FIG. 6 to FIG. 11 in the first embodiment. Also, in FIG. 14 and FIG. 15, the same constitutional elements as those in the first embodiment carry the same reference numerals, and the explanations thereof are omitted.

In this embodiment, the case is described in which a non-patterned first light shield film (a light shield layer) is formed in the non-formation region of the transistor elements as well as the formation region of the transistor elements.

In this embodiment, the non-formation region of the transistor elements actually implies a seal region where the sealing member to laminate the opposite substrate is coated, a peripheral portion of the driving circuit for driving the data line and the scanning line, a terminal pad region to form connection terminals through which the input output signal lines are connected, and the like. They exist at the peripheral region of the formation region (pixel portion) of the transistor elements.

As shown in FIG. 14(*a*), similarly to the first embodiment, the first light shield film (the light shield layer) 11*a* having the predetermined pattern is formed on the surface of the substrate main body 10A of the TFT array substrate 10. In this embodiment, the first light shield film (the light shield layer) 11*a* having the predetermined pattern (refer to FIG. 2) is formed in the formation region of the transistor elements, and the non-patterned first light shield film (insulation layer) 11*a* is formed in the non-formation region of the transistor elements. The film thickness of the first light shield film 11*a* is, for example, about 150 to 200 nm.

As shown in FIG. 14(*b*), similarly to the first embodiment, the first insulation layer 12A is formed on the surface of the substrate main body 10A on which the first light shield film (insulation layer) 11*a* has been formed. The film thickness of the first insulation layer 12A is set to be at least thicker than that of the first light shield film 11*a*. For example, it is set to about 400 to 1000 nm, preferably, about 800 nm.

As shown in FIG. 14(*c*), similarly to the first embodiment, the second insulation layer 12B whose polishing rate is lower than that of the first insulation layer 12A is formed on the surface of the first insulation layer 12A. The film thickness of the second insulation layer 12B is determined on the basis of the difference of the polishing rate from a third insulation layer 12C to be formed at a next step, and is set at a thickness at which the excessively polished degree can be avoided in a later-described polishing step at about 50 to 150 nm, for example.

Next, as shown in FIG. 15(*a*), the third insulation layer 12C whose polishing rate is higher than that of the second insulation layer 12B is formed on the surface of the second insulation layer 12B, by the sputtering method, the CVD method and the like. The film thickness of the third insulation layer 12C is set to be at least higher than the height of the stage difference formed on the surface of the substrate main body 10A on which the second insulation layer 12B has been formed. That is, the film thickness of the third insulation layer 12C is set to be at least thicker than that of the first light shield film 11*a*. For example, it is set to about 300 nm.

Oxide silicon can be exemplified as the materials of the first insulation layer 12A and the third insulation layer 12C. Nitride silicon can be exemplified as the material of the second insulation layer 12B whose polishing rate is lower than those of the first insulation layer 12A and the third insulation layer 12C. The polishing rate of the nitride silicon is about ⅓ to ⅕ of the polishing rate of the oxide silicon.

The surface of the substrate main body 10A on which the third insulation layer 12C is formed is concave and convex in the formation region of the transistor elements, as shown in FIG. 15(*a*), and it is flat convex in the non-formation region of the transistor elements.

Next, the surface of the substrate main body 10A, on which the third insulation layer 12C is formed, is polished by the CMP (Chemically Mechanically Polishing) method and the like.

Figure 15B:
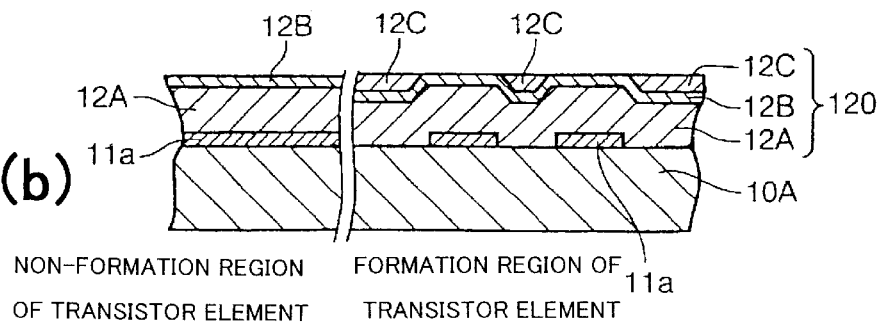

In this step, the third insulation layer 12C having the high polishing rate is firstly polished in the non-formation region and the convex portion in the formation region of the transistor elements. After that, when the polished depth reaches the heights of the second insulation layer 12B in the non-formation region and the convex portion in the formation region of the transistor elements, the area occupied by the second insulation layer 12B whose polishing rate is low is increased on the surface of the substrate main body 10A, and the polishing speed is dropped. So, the stop of the polishing operation at this time enables the formation of a first interlayer insulation film 120, which is composed of: the first insulation layer 12A; the second insulation layer 12B that is formed on the surface of the first insulation layer 12A and has the polishing rate lower than that of the first insulation layer 12A; and the third insulation layer 12C that is partially formed on the surface of the second insulation layer 12B and has the polishing rate higher than that of the second insulation layer 12B, as shown in FIG. 15(b). The surface of the first interlayer insulation film 120 is accordingly smoothed.

By the way, in this step, the second insulation layers 12B on the convex portions in the formation region and the non-formation region of the transistor elements may not be polished at all, or may be slightly polished and accordingly thinned. In either case, the polishing operation is done such that the first insulation layer 12A is not exposed on the surface of the substrate main body 10A.

According to the method of manufacturing the electro-optical apparatus substrate in this embodiment, the first light shield film (the insulation layer) 11a is formed even in the non-formation region of the transistor elements, on the surface of the substrate main body (the optically transparent substrate) 10A. Then, the first insulation layer 12A, the second insulation layer 12B having the polishing rate lower than that of the first insulation layer 12A, and the third insulation Layer 12C having the polishing rate higher than that of the second insulation layer 12B are formed on the surface of the substrate main body 10A on which the first light shield film (light shield layer) 11a has been formed. After that, the surface of the substrate main body 10A is polished to thereby enable the formation of the first interlayer insulation film (insulation layer) 120 whose surface is smoothed. Thus, the void is hardly induced at the lamination boundary between the first interlayer insulation film (insulation layer) 120 and the single crystal silicon layer. Hence, it is possible to prevent the performance of the TFT (transistor element) from being deteriorated.

The lamination strength between the first interlayer insulation film (the insulation layer) 120 and the single crystal silicon layer can be reserved to thereby prevent the defects such as the film strip and the like from being brought about in the step of forming the TFT (transistor element). Accordingly, the yield of the product can be improved The method of manufacturing the electro-optical apparatus substrate in this embodiment can provide the TFT array substrate (the electro-optical apparatus substrate) (i) which has the first interlayer insulation film (the insulation layer) 120 provided with: the first insulation layer 12A; the second insulation layer 12B which is formed on the surface of the first insulation layer 12A and has the polishing rate lower than that of the first insulation layer 12A; and the third insulation layer 12C which is partially formed on the surface of the second insulation layer 12B and has the polishing rate higher than that of the second insulation layer 12B, to thereby have the smoothed surface, and (ii) in which the semiconductor layer constituting the TFT (transistor element) is formed by the single crystal silicon layer.

Also, since this contains the TFT array substrate (the electro-optical apparatus substrate) manufactured by the method of manufacturing the electro-optical apparatus substrate in this embodiment, it is possible to provide the liquid crystal device (the electro-optical apparatus) having the excellent performance, in which there is no or little void on the lamination boundary between the first interlayer insulation film (insulation layer) 120 and the single crystal silicon layer, and the lamination strength between the first interlayer insulation film (insulation layer) 120 and the single crystal silicon layer is strong, so that the variation and the defect are hardly induced in the property of the transistor element.

In addition, in this embodiment, only the case is described in which the non-patterned first light shield film (the light shield layer) is formed in the non-formation region of the transistor elements. However, the similar effect can be obtained under any pattern, such as the case in which the pattern of the first light shield film formed in the non-formation region of the transistor elements is equal to the first light shield formed in the formation region of the transistor elements.

III. Third Embodiment
(Structure of Electro-Optical Apparatus)

Next, the structure of the electro-optical apparatus of the third embodiment according to the present invention is described with reference to FIG. 16.

The differences between the structure of the electro-optical apparatus in this embodiment and that in the first embodiment is the structure related to the first interlayer insulation film 12 in association with the first light shield film 11a. Otherwise, the structure of the second embodiment is same as that of the first embodiment shown in FIG. 1 to FIG. 3. Thus, only this different feature is explained here with reference to FIG. 16. FIG. 16 corresponds to FIG. 3 of the first embodiment, and is a sectional view taken on the line A–A' of FIG. 2. In FIG. 16, the same constitutional elements as those in the first embodiment shown in FIG. 1 to FIG. 3 carry the same reference numerals, and the explanations thereof are omitted.

As shown in FIG. 16, in the third embodiment, in the area where the first light shield film 11a is not formed, right above the substrate main body 10A, a first insulation layer 12A' is formed. The first insulation layer 12A' has the same thickness as the first light shield film 11a, and its surface is smoothed. On the surface of the first light shield film 11a and the first insulation layer 12A', a second insulation layer 12B' is formed. The second insulation layer 12B' is formed over the whole surface of the substrate main body 10A. Accordingly, a first interlayer insulation film 12', which is to electrically isolate the semiconductor layer 1a constructing the pixel switching TFT 30 from the first light shield film 11a, is composed of the first insulation layer 12A' and the second insulation layer 12B' on the TFT array substrate 10.

(Method of Manufacturing Electro-Optical Apparatus Substrate)

Next, the method of manufacturing the electro-optical apparatus of the third embodiment according to the present invention is described with reference to FIG. 17.

The differences between the method of manufacturing the electro-optical apparatus in this embodiment and that in the first embodiment is the processes related to the first interlayer insulation film 12 in association with the first light shield film 11a. Otherwise, the manufacturing method of the second embodiment is same as that of the first embodiment. Thus, only this different feature is explained here with reference to FIG. 17. FIG. 17 corresponds to FIG. 5 of the first embodiment and is a step view showing a part of the TFT array substrate in the respective steps, correspondingly to the A–A' section of FIG. 2, similarly to FIG. 16. In FIG. 17, the same constitutional elements as those in the first embodiment carry the same reference numerals, and the explanations thereof are omitted.

Figure 4A:
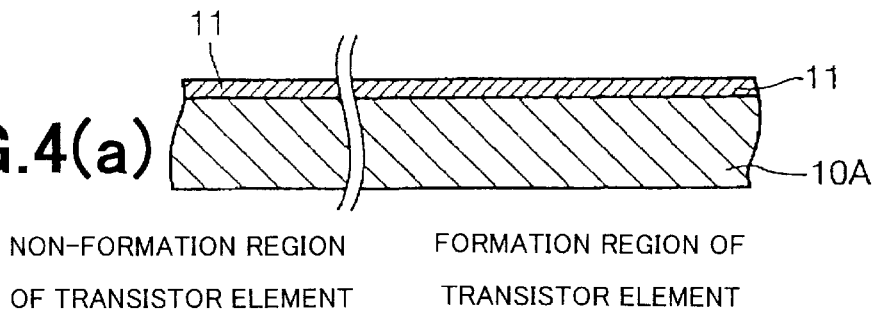
FIGS. 4(a) to 4(c) are process diagrams showing a method of manufacturing the electro-optical apparatus substrate of the first embodiment according to the present invention.
Figure 4B:
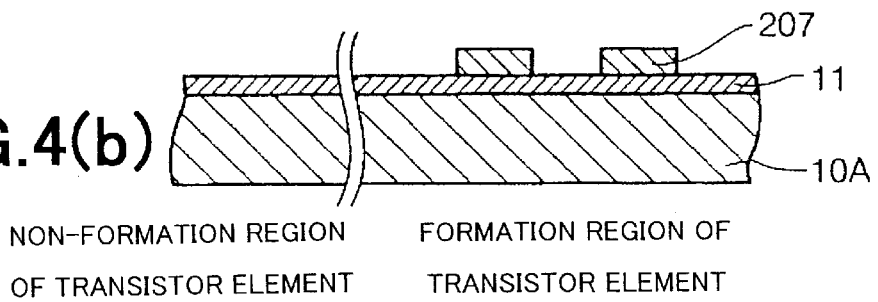
Figure 4C:
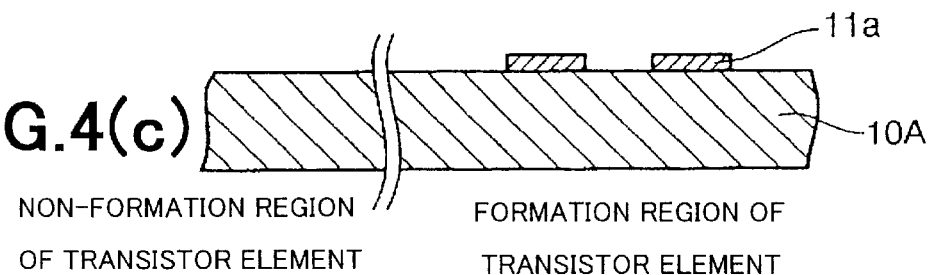

At first the processes shown in FIGS. 4(a) to 4(c) are performed in the same manner as the first embodiment.

Then, as shown in FIG. 17(a), an insulation layer 12X is formed all over the surface of the substrate main body 10A on which the first light shield film 11a has been formed, by the sputtering method, the CVD method and the like. As the material of the insulation layer 12X, the oxide silicon, the nitride silicon, or the high insulation glass such as NSG (Non-doped Silicon Glass), PSG Phosphorus Silicate Glass), BSG (Boron Silicate Glass), BPSG (Boron Phosphorus Silicate Glass) and the like. Also, a film thickness of the insulation layer 12X is set to be at least thicker than that of the first light shield film 11a, and is to, for example, about 400 to 1000 nm, preferably, about 800 nm.

As shown in FIG. 17(b), the surface of the substrate main body 10A on which the insulation layer 12X has been formed is polished until the surface of the first light shield film 11a is exposed, by means of the CMP method or the like.

By polishing the surface of the substrate main body 10A in this manner, the portion of the insulation layer 12X formed above the level of the first light shield film 11a is removed, so that the portion of the insulation layer 12X remains in the region where the first light shield film 11a is not formed. Namely, only the first insulation layer 12A' remains, which has the same thickness as the first light shield film 11a, and the surface of the substrate main body 10A is smoothed.

Also, in this process, by making the best use of the fact that the material of the first light shield film 11a and the material of the insulation layer 12X (i.e., the first insulation layer 12A') are different from each other, it is possible to detect the stopping point of polishing. For example, in case of using the CMP method, since the first light shield film 11a comprising metal or the like does not chemically react with the polishing liquid, at the moment when the surface of the first light shield film 11a is exposed, the friction force between the polishing pad for polishing the substrate main body 10A and the substrate main body 10A is certainly dropped. Further, the vibration of the substrate holder for holding the substrate main body 10A is changed at this moment. Therefore, by detecting the change of the friction force between the polishing pad and the substrate main body 10A, or the vibration of the substrate holder, it is possible to easily detect the stopping point of polishing.

In this manner, in the present embodiment, since the stopping point of polishing can be detected by detecting the moment when the surface of the first light shield film 11a is exposed, the first light shield film 11a has the function to stop polishing or has the function of a so-called "stopper" for polishing.

Then, as shown in FIG. 5(c), a second insulation layer 12B' is formed all over the substrate main body 10A, on which the first light shield film 11a and the first insulation layer 12A' have been formed, by using the sputtering method, the CVD method and the like. As the material of the second insulation layer 12B', the oxide silicon, the nitride silicon, or the high insulation glass such as NSG, PSG, BSG, BPSG and the like. In addition, although the second insulation layer 12B' may be different in material from the first insulation layer 12A', it is desirable to form the second insulation layer 12B' from the same material as the first insulation layer 12A' in order to simplify the manufacturing process.

The surface of the second insulation layer 12A' formed by this process is smoothed since it is formed on the first light shield film 11a and the first insulation layer 12A' whose surfaces are smoothed. Accordingly, the first insulation film 12' whose surface is smoothed can be formed, which consists of the first insulation layer 12A' and the second insulation layer 12B'.

After that, the same processes as the first embodiment shown in FIG. 6 to FIG. 11 are performed.

According to the method of producing the electro-optical apparatus substrate of the present embodiment, since the insulation layer 12X is formed on the substrate main body (the optically transparent substrate) 10A on which the first light shield film (the light shield layer) 11a has been formed, and the surface of the substrate main body 10A on which the insulation lyaer 12X has been formed is polished until the first light shield film 11a is exposed. Hence, in the region where the first light shield film 11a is not formed, the first insulation layer 12A' is formed which has the same thickness as the first light shield film 11a, so that the surface of the substrate main body 10A on which the first light shield film 11a and the first insulation layer 12A' have been formed can be smoothed, and that the stopping point of polishing can be easily detected.

Further, by forming the second insulation layer 12B' on the first insulation layer 12A' and the first light shield film 11a whose surfaces have been smoothed, the first interlayer insulation film 12 whose surface is smoothed can be formed, which consists of the first insulation layer 12A' and the second insulation layer 12B'. Hence, the surface of the substrate main body 10A, which is to be laminated on the single crystal silicon layer 206, can be smoothed. In this manner, since the surface of the substrate main body 10A to be laminated on the single crystal silicon layer 206 can be smoothed, it is possible to prevent the void from being induced at the boundary surface between the first interlayer insulation film 12 and the single crystal silicon layer 206, so that it is possible to prevent the property of the TFT (transistor element) 30 from being deteriorated.

Also, the lamination strength between the first interlayer insulation film 12 and the single crystal silicon layer 206 can be reserved to thereby prevent the defects such as the film strip and the like from being induced in the step of forming the TFT (transistor element) 30. Accordingly, the yield of the product can be improved.

Also, in the present embodiment, after forming the first insulation layer 12A', the second insulation layer 12B' are formed on the surface of the first light shield film 11a and the first insulation layer 12A', and the TFT (transistor element) 30 is formed on the surface of the second insulation layer 12B'. Hence, it is possible to almost perfectly prevent the pollution to the TFT (the transistor element) 30 from the first light shield film 11a.

In addition, since the oxide film 206b is formed in advance on the surface of the single crystal silicon substrate 206a at its side of the lamination, which is used for the lamination, even if the single crystal silicon substrate 206a is laminated directly on the surface of the first light shield film 11a comprising metal or the like to thereby form the TFT (the transistor element) 30 thereon, if the pollution from the first light shield film 11a to the TFT (the transistor element) 30 can be sufficiently prevented by the oxide film 206b, it is desirable to laminate the single crystal silicon substrate 206a immediately after the first light shield film 11a and the first insulation layer 12A' are formed, without forming the second insulation layer 112B'. By this, since the process of forming the second insulation layer 12B' is omitted, it is possible to simplify the manufacturing process.

In this case, it is possible to provide the TFT array substrate (the electro-optical apparatus substrate) provided with: the first light shield film 11a having the predetermined pattern; the first insulation layer 12A', which is formed in the region where the first light shield film 11a is not formed, which has the same thickness as the first light shield film (the light shield layer) 11*a* and whose surface is smoothed; and the TFT (the transistor element) 30 directly formed on the surface of the first light shield film 11*a*, on one surface of the substrate main body (the optically transparent substrate) 10A.

In addition, in this embodiment, only the case is described in which the first light shield film 11*a* is formed only within the formation region of the transistor elements (the pixel region). However, the present invention is not limited to this. The first light shield film 11*a* may be formed in the non-formation region of the transistor elements, so that the similar effect can be still obtained. In case that the first light shield film 11*a* is formed within the non-formation region of the transistor elements, the pattern of the first light shield film 11*a* within the non-formation region of the transistor elements may be same as that in the formation region of the transistor elements, may be different pattern or any pattern, or may have no pattern at all.

(Electronic Apparatus)

As an example of an electronic apparatus using the liquid crystal device (electro-optical apparatus) having the electro-optical apparatus substrate manufactured by the method of manufacturing the electro-optical apparatus substrate according to the first, second or third embodiment, the configuration of a projection display device will be described below with reference to FIG. 18.

In FIG. 18, a projection display 1100 includes three liquid crystal devices each having the electro-optical apparatus substrate manufactured by the method of manufacturing the electro-optical apparatus substrate, according to the first, second or third embodiment. It shows the schematic configuration view of the optical system in the projection display device, which uses the respective devices as RGB liquid crystal devices 962R, 962G and 962B.

The optical system of the projection display device in this example employs a light source unit 920 and a regularly illuminating optical system 923. The projection display device is provided with: a color separation optical system 924 serving as a color separator for separating a light flux W outputted from this regularly illuminating optical system 923 into a red (R), a green (G) and a blue (B); three light valves 925R, 925G and 925B serving as modulators for modulating the respective color light fluxes R, G and B; a color synthesis prism 910 serving as a color synthesizer for again synthesizing the color light fluxes after the modulation; and a projection lens unit 906 serving as a projector for enlarging the synthesized light fluxes and then projecting onto the surface of a projection plane 100. Also, it includes a light guiding system 927 for guiding the blue light flux B to the corresponding light valve 925B.

The regularly illuminating optical system 923 has two lens plates 921 and 922 and a reflection mirror 931. It is designed such that the two lens plates 921 and 922 are orthogonal to each other with the reflection mirror 931 therebetween. Each of the two lens plates 921 and 922 in the regularly illuminating optical system 923 has a plurality of rectangular lenses arranged in a form of matrix. A light flux outputted from the light source unit 920 is divided into a plurality of partial light fluxes by the rectangular lenses of the first lens plate 921. Then, those partial light fluxes are superimposed on each other near the three light valves 925R, 925G and 925B by the rectangular lenses of the second lens plate 922. Thus, the usage of the regularly illuminating optical system 923 enables the three light valves 925R, 925G and 925B to be illuminated under the regular illumination lights, even if the light source unit 920 has the irregular illumination distribution within the section of the output light flux.

Each color separation optical system 924 is composed of a blue green reflection dichroic mirror 941, a green reflection dichroic mirror 942 and a reflection mirror 943. At first, the blue green reflection dichroic mirror 941 squarely reflects the blue light flux B and the green light flux G contained by the light flux W, and they are directed to the side of the green reflection dichroic mirror 942. The red light flux R is passed through this mirror 941, and squarely reflected by the rear reflection mirror 943, and then outputted from an output unit 944 of the red light flux R to the side of the prism unit 910.

Next, the green reflection dichroic mirror 942 squarely reflects only the green light flux G among the blue and green light fluxes B and G reflected by the blue green reflection dichroic mirror 941. Then, it is outputted from an output unit 945 of the green light flux G to the side of the color synthesis optical system. The blue light flux B passed through the green reflection dichroic mirror 942 is outputted from an output unit 946 of the blue light flux B to the side of a light guidance system 927. This example is designed such that the distances from the output unit of the light flux W of the regularly illuminating optical system to the output units 944, 945 and 946 of the respective color light fluxes in the color separation optical system 924 are substantially equal to each other.

Light collection lenses 951 and 952 are disposed on the output sides of the output units 944 and 945 of the red and green light fluxes R and G in the color separation optical system 924, respectively. Thus, the red and green light fluxes R and G outputted from the respective output units are inputted to those light collection lenses 951 and 952, and made parallel to each other.

The thus-paralleled red and green light fluxes R and G are inputted to the light valves 925R and 925G, and modulated respectively. Then, the video information corresponding to each of the color lights is added to each of them. That is, a driver (not shown) performs the switching control on those liquid crystal devices, on the basis of the video information. Accordingly, the respective color lights passed through them are modulated. On the other hand, the blue light flux B is guided through the light guide system 927 to the corresponding light valve 925B. Here, it is similarly modulated on the basis of the video information. By the way, the light valves 925R, 925G and 925B in this example are the liquid crystal light valves respectively further composed of input side polarization units 960R, 960G and 960B, output side polarization units 961R, 961G and 961B, and liquid crystal devices 962R, 962G and 962B between them.

The light-guide system 927 is provided with: a light collection lens 954 disposed on the output side of the output unit 946 for the blue light flux B; an input side reflection mirror 971; an output side reflection mirror 972; a middle lens 973 disposed between those reflection mirrors; and a light collection lens 953 disposed on a front side of the light valve 925B. The blue light flux B outputted from the light collection lens 946 is guided through the light guide system 927 to the liquid crystal device 962B, and modulated thereby. As for the lengths of the light paths for the respective color light fluxes, namely, as for the distances from the output unit of the light flux W to the respective liquid crystal devices 962R, 962G and 962B, the light path for the blue light flux B is the longest. Thus, the loss in the light amount of the blue light flux becomes the largest. However, the intervention of the light guide system 927 enables the loss in the light amount to be suppressed.

The respective color light fluxes R, G and B modulated through the respective light valves 925R, 925G and 925B are inputted to the color synthesis prism 910, and synthesized thereby. Then, the light synthesized by this color synthesis prism 910 is enlarged and projected through the projection lens unit 906 onto the surface of the projection plane 100 located at a predetermined position.

In this example, the first light shield film (the light shield layer) is disposed on the lower side of the TFT, in the liquid crystal devices 962R, 962G and 962B. Thus, even if a part of the reflection light resulting from the projection optical system within the liquid crystal projector based on the projection lights from the liquid crystal devices 962R, 962G and 962B, the reflection light from the surface of the TFT array substrate when the projection light is passed, and the projection light protruding from the projection optical system after the output from another liquid crystal device is inputted as the return light from the side of the TFT array substrate, the light shield action can be sufficiently performed with respect to the channel of the TFT for switching the pixel electrode.

For this reason, even if the prism unit suitable for miniaturization is used in the projection optical system, it is not necessary to separately mount a film for protecting the return light or to perform a return light protection process on the polarization unit, between the respective liquid crystal devices 962R, 962G and 962B and the prism unit. Thus, this is very advantageous in making the configuration smaller and simpler.

Figure 19A:
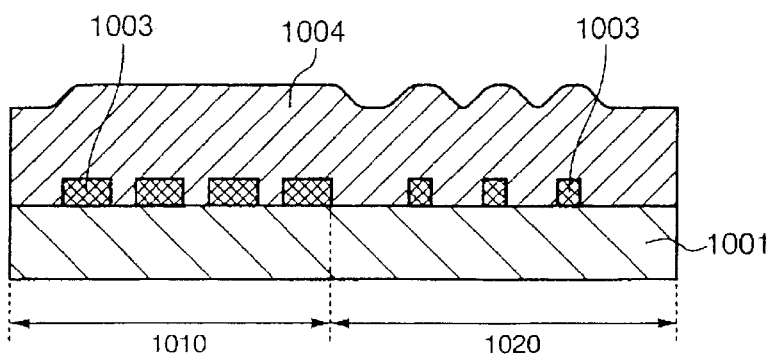
FIGS. 19(a) and 19(b) are views describing conventional problems.
Figure 19B:
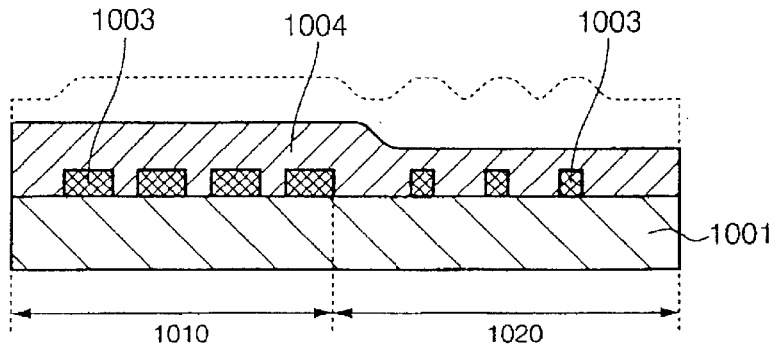

In this embodiment, it is possible to suppress the influence on the channel region of the TFT, which is caused by the return light. Thus, it is not necessary to directly stick the polarization units 961R, 961G and 961B, on which the return light protection process is performed, on the liquid crystal device. So, as shown in FIG. 19, the polarization units can be constituted separately from the liquid crystal device. Actually, the polarization units 961R, 961G and 961B on one side can be stuck on the prism unit 910, and the polarization units 960R, 960G and 960B on the other side can be stuck on the light collection lenses 953, 945 and 944. In this way, by sticking the polarization units on the prism unit or the light collection lenses, the heat of the polarization unit is absorbed by the prism unit or the light collection lenses. Thus, it is possible to protect the temperature rise of the liquid crystal device.

Also, although the illustration is omitted, by arranging the liquid crystal device and the polarization unit separately from each other, the air layer is generated between the liquid crystal device and the polarization unit. Hence, the temperature rise of the liquid crystal device can be further suppressed by mounting a cooler and sending wind, such as cold wind and the like, between the liquid crystal device and the polarization unit. Therefore, it is possible to protect the erroneous operation caused by the temperature rise of the liquid crystal device.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosures of Japanese Patent Application No.2000-288460 filed on Sep. 22, 2000 and Japanese Patent Application No.2000-291005 filed on Sep. 25, 2000 including the specification, claims, drawings and summary are incorporated herein by reference in its entirety.

What is claimed is:

1. A method of manufacturing an electro-optical apparatus substrate, comprising the processes of:
    forming a light shield layer above one surface of an optically transparent substrate;
    patterning a light shield layer to thereby form a patterned light shield layer at least in a formation region of each transistor element to be formed;
    forming a first insulation layer above said one surface of said optically transparent substrate above which said patterned light shield layer has been formed;
    forming a second insulation layer having a polishing rate lower than that of said first insulation layer, on said first insulation layer;
    polishing a surface of said second insulation layer;
    laminating a single crystal silicon layer above said polished surface of said second insulation layer; and
    forming said each transistor element by using said single crystal silicon layer.

2. A method according to claim 1, wherein said first insulation layer is partially exposed by the step of polishing the surface of said second insulation layer.

3. A method according to claim 2, wherein a height of an exposed surface of said first insulation layer with respect to said one surface of said optically transparent substrate is same as that of said polished surface of said second insulation layer.

4. A method according to claim 1, wherein, at the step of patterning said light shield layer, said patterned light shield layer is formed only in the formation region of said each transistor element.

5. A method of manufacturing an electro-optical apparatus substrate, comprising the processes of:
    forming a light shield layer above one surface of an optically transparent substrate;
    patterning said light shield layer to thereby form a patterned light shield layer at least in a formation region of each transistor element to be formed;
    forming a first insulation layer above said one surface of said optically transparent substrate above which said patterned light shield layer has been formed;
    forming a second insulation layer having a polishing rate lower than that of said first insulation layer, on said first insulation layer;
    forming a third insulation layer having a polishing rate higher than that of said second insulation layer, on said second insulation layer;
    polishing a surface of said third insulation layer;
    laminating a single crystal silicon layer above said polished surface of said third insulation layer; and
    forming said each transistor element by using said single crystal silicon layer.

6. A method according to claim 5, wherein said second insulation layer is partially exposed by the step of polishing the surface of said third insulation layer.

7. A method according to claim 6, wherein a height of an exposed surface of said second insulation layer with respect to said one surface of said optically transparent substrate is same as that of said polished surface of said third insulation layer.

8. A method according to claim 5, wherein, at the step of patterning said light shield layer, said patterned light shield layer is formed in a non-formation region of said each transistor element where said each transistor element is not formed.

9. A method of manufacturing an electro-optical apparatus substrate, comprising the processes of:

forming a light shield layer above one surface of an optically transparent substrate;

patterning a light shield layer to thereby form a patterned light shield layer at least in a formation region of each transistor element to be formed;

forming an insulation layer on said one surface of said optically transparent substrate on which said patterned light shield layer has been formed;

polishing a surface of said insulation layer until a surface of said patterned light shield layer is exposed;

laminating single crystal silicon layer above said polished surface of said insulation layer and said exposed surface of said patterned light shield layer; and forming said each transistor element by using said single crystal silicon layer.

10. A method of manufacturing an electro-optical apparatus substrate, comprising the processes of:

forming a light shield above one surface of an optically transparent substrate;

patterning said light shield layer to thereby form a patterned light shield layer at least in a formation region of each transistor element to be formed;

forming a first insulation layer on said one surface of said optically transparent substrate on which said patterned light shield layer has been formed;

polishing a surface of said first insulation layer until a surface of said patterned light shield layer is exposed;

forming a second insulation layer above said polished surface of said first insulation layer;

laminating a single crystal silicon layer above said second insulation layer; and forming said each transistor element by using said single crystal silicon layer.

11. An electro-optical apparatus substrate comprising a patterned light shield layer having a pattern, an insulation film and a transistor, which are sequentially formed above one surface of an optically transparent substrate, said insulation film comprising (i) a first insulation layer and (ii) a second insulation layer, which is partially formed on said first insulation layer and whose polishing rate is lower than that of said first insulation layer, so that a surface of said insulation film is smoothed, said transistor element having a semiconductor layer comprising a single crystal silicon layer.

12. An electro-optical apparatus substrate according to claim 11, wherein said first insulation layer and said second insulation layer form a same smoothed surface.

13. An electro-optical apparatus substrate according to claim 11, wherein, said patterned light shield layer is formed only in an formation region of said transistor element.

14. An electro-optical apparatus substrate according to claim 11, wherein said first insulation layer comprises silicon oxide, and said second insulation layer comprises silicon nitride.

15. An electro-optical apparatus substrate comprising a patterned light shield layer having a pattern, an insulation film and a transistor, which are sequentially formed above one surface of an optically transparent substrate, said insulation film comprising (i) a first insulation layer, (ii) a second insulation layer, which is formed on said first insulation layer and whose polishing rate is lower than that of said first insulation layer, and (iii) a third insulation layer, which is partially formed on said second insulation layer and whose polishing rate is higher than that of said second insulation layer, so that a surface of said insulation film is smoothed, said transistor element having a semiconductor layer comprising a single crystal silicon layer.

16. An electro-optical apparatus substrate according to claim 15, wherein said second insulation layer and said third insulation layer form a same smoothed surface.

17. An electro-optical apparatus substrate according to claim 15, wherein, said patterned light shield layer is formed in a non-formation region of said each transistor element where said each transistor element is not formed.

18. An electro-optical apparatus substrate according to claim 15, wherein said first insulation layer and said third insulation layer comprise silicon oxide, and said second insulation layer comprises silicon nitride.

19. An electro-optical apparatus substrate comprising:

patterned light shield layer having a surface and a pattern above one surface of an optically transparent substrate;

an insulation layer which is formed above said one surface of said optically transparent substrate at an area where said patterned light shield layer is not formed, whose surface is smoothed side by side with said surface of said patterned light shield layer;

a transistor element, which is formed above said patterned light shield layer and has a semiconductor layer comprising a single crystal silicon layer.

20. An electro-optical apparatus substrate according to claim 19, wherein said patterned light shield layer and said insulation layer form a same smoothed surface.

21. An electro-optical apparatus substrate according to claim 19, wherein said insulation layer is formed by polishing a surface of an insulation film formed on said one surface of said optically transparent substrate on which said patterned light shield layer has been formed, said patterned light shield layer functioning as a stopper for polishing in a process of polishing said insulation film.

22. An electro-optical apparatus substrate according to claim 19, wherein, on the surface of said patterned light shield layer and said insulation layer, a second insulation layer is formed, said transistor element being disposed on a surface of said second insulation layer.

23. An electro-optical apparatus comprising:

(A) an electro-optical apparatus substrate comprising a patterned light shield layer having a pattern, an insulation film and a transistor, which are sequentially formed above one surface of an optically transparent substrate, said insulation film comprising (i) a first insulation layer and (ii) a second insulation layer, which is partially formed on said first insulation layer and whose polishing rate is lower than that of said first insulation layer, so that a surface of said insulation film is smoothed, said transistor element having a semiconductor layer comprising a single crystal silicon layer;

(B) another optically transparent substrate disposed to be opposed to said one surface of said optically transparent substrate of said electro-optical apparatus substrate; and (C) an electro-optical material layer sandwiched between said two optically transparent substrates.

24. An electro-optical apparatus comprising:
(A) an electro-optical apparatus substrate comprising a patterned light shield layer having a pattern, an insulation film and a transistor, which are sequentially formed above one surface of an optically transparent substrate,
said insulation film comprising (i) a first insulation layer, (ii) a second insulation layer, which is formed on said first insulation layer and whose polishing rate is lower than that of said first insulation layer, and (iii) a third insulation layer, which is partially formed on said second insulation layer and whose polishing rate is higher than that of said second insulation layer, so that a surface of said insulation film is smoothed,
said transistor element having a semiconductor layer comprising a single crystal silicon layer;
(B) another optically transparent substrate disposed to be opposed to said one surface of said optically transparent substrate of said electro-optical apparatus substrate; and
(C) an electro-optical material layer sandwiched between said two optically transparent substrates.

25. An electro-optical apparatus comprising:
(A) an electro-optical apparatus substrate comprising:
a patterned light shield layer having a surface and a pattern above one surface of an optically transparent substrate;
an insulation layer which is formed above said one surface of said optically transparent substrate at an area where said patterned light shield layer is not formed, whose surface is smoothed side by side with said surface of said patterned light shield layer;
a transistor element, which is formed above said patterned light shield layer and has a semiconductor layer comprising a single crystal silicon layer;
(B) another optically transparent substrate disposed to be opposed to said one surface of said optically transparent substrate of said electro-optical apparatus substrate; and
(C) an electro-optical material layer sandwiched between said two optically transparent substrates.

26. An electronic apparatus comprising:
(A) an electro-optical apparatus substrate comprising a patterned light shield layer having a pattern, an insulation film and a transistor, which are sequentially formed above one surface of an optically transparent substrate,
said insulation film comprising (i) a first insulation layer and (ii) a second insulation layer, which is partially formed on said first insulation layer and whose polishing rate is lower than that of said first insulation layer, so that a surface of said insulation film is smoothed,
said transistor element having a semiconductor layer comprising a single crystal silicon layer;
(B) another optically transparent substrate disposed to be opposed to said one surface of said optically transparent substrate of said electro-optical apparatus substrate; and
(C) an electro-optical material layer sandwiched between said two optically transparent substrates.

27. An electronic apparatus comprising:
(A) an electro-optical apparatus substrate comprising a patterned light shield layer having a pattern, an insulation film and a transistor, which are sequentially formed above one surface of an optically transparent substrate,
said insulation film comprising (i) a first insulation layer, (ii) a second insulation layer, which is formed on said first insulation layer and whose polishing rate is lower than that of said[]first insulation layer, and (iii) a third insulation layer, which is partially formed on said second insulation layer and whose polishing rate is higher than that of said second insulation layer, so that a surface of said insulation film is smoothed,
said transistor element having a semiconductor layer comprising a single crystal silicon layer;
(B) another optically transparent substrate disposed to be opposed to said one surface of said optically transparent substrate of said electro-optical apparatus substrate; and
(C) an electro-optical material layer sandwiched between said two optically transparent substrates.

28. An electronic apparatus comprising:
(A) an electro-optical apparatus substrate comprising:
a patterned light shield layer having a surface and a pattern on one surface of an optically transparent substrate;
an insulation layer which is formed above said one surface of said optically transparent substrate at an area where said patterned light shield layer is not formed, whose surface is smoothed side by side with said surface of said patterned light shield layer;
a transistor element, which is formed above said patterned light shield layer and has a semiconductor layer comprising a single crystal silicon layer;
(B) another optically transparent substrate disposed to be opposed to said one surface of said optically transparent substrate of said electro-optical apparatus substrate; and
(C) an electro-optical material layer sandwiched between said two optically transparent substrates.

29. A method of manufacturing an electro-optical apparatus substrate, comprising the processes of:
forming a light shield layer above one surface of an optically transparent substrate;
patterning said light shield layer to thereby form a patterned light shield layer at least in a formation region of each transistor element to be formed;
forming a first insulation layer above said one surface of said optically transparent substrate above which said patterned light shield layer has been formed;
forming a second insulation layer having a polishing rate lower than that of said first insulation layer, on said first insulation layer;
polishing a surface of said second insulation layer;
forming a silicon layer above said polished surface of said second insulation layer; and
forming said each transistor element by using said silicon layer.

30. A method of manufacturing an electro-optical apparatus substrate, comprising the processes of:
forming a light shield layer above one surface of an optically transparent substrate;
patterning said light shield layer to thereby form a patterned light shield layer at least in a formation region of each transistor element to be formed;
forming a first insulation layer above said one surface of said optically transparent substrate above which said patterned light shield layer has been formed;

forming a second insulation layer having a polishing rate lower than that of said first insulation layer, on said first insulation layer;

forming a third insulation layer having a polishing rate higher than that of said second insulation layer, on said second insulation layer;

polishing a surface of said third insulation layer;

forming a silicon layer above said polished surface of said third insulation layer; and forming said each transistor element by using said silicon layer.

31. A method of manufacturing an electro-optical apparatus substrate, comprising the processes of:

forming a light shield layer above one surface of an optically transparent substrate;

patterning said light shield layer to thereby form a patterned light shield layer at least in a formation region of each transistor element to be formed;

forming an insulation layer on said one surface of said optically transparent substrate on which said patterned light shield layer has been formed;

polishing a surface of said insulation layer until a surface of said patterned light shield layer is exposed;

forming a silicon layer above said polished surface of said insulation layer and said exposed surface of said patterned light shield layer; and forming said each transistor element by using said silicon layer.

32. A method of manufacturing an electro-optical apparatus substrate, comprising the processes of:

forming a light shield layer above one surface of an optically transparent substrate;

patterning said light shield layer to thereby form a patterned light shield layer at least in a formation region of each transistor element to be formed;

forming a first insulation layer on said one surface of said optically transparent substrate on which said patterned light shield layer has been formed;

polishing a surface of said first insulation layer until a surface of said patterned light shield layer is exposed;

forming a second insulation layer above said polished surface of said first insulation layer;

forming a silicon layer above said second insulation layer; and forming said each transistor element by using said silicon layer.

33. An electro-optical apparatus substrate comprising a patterned light shield layer having a predetermined pattern, an insulation film and a transistor, which are sequentially formed above one surface of an optically transparent substrate, said insulation film comprising (i) a first insulation layer and (ii) a second insulation layer, which is partially formed on said first insulation layer and whose polishing rate is lower than that of said first insulation layer, so that a surface of said insulation film is smoothed.

34. An electro-optical apparatus substrate comprising a patterned light shield layer having a pattern, an insulation film and a transistor, which are sequentially formed above one surface of an optically transparent substrate, said insulation film comprising (i) a first insulation layer, (ii) a second insulation layer, which is formed on said first insulation layer and whose polishing rate is lower than that of said first insulation layer, and (iii) a third insulation layer, which is partially formed on said second insulation layer and whose polishing rate is higher than that of said second insulation layer, so that a surface of said insulation film is smoothed.

35. An electro-optical apparatus substrate comprising:

a patterned light shield layer having a surface and a pattern above one surface of an optically transparent substrate;

an insulation layer which is formed above said one surface of said optically transparent substrate at an area where said patterned light shield layer is not formed, whose surface is smoothed side by side with said surface of said patterned light shield layer;

a transistor element, which is formed above said patterned light shield layer.

36. A method of manufacturing an electro-optical apparatus substrate, comprising the processes of:

forming a light shield layer above one surface of an optically transparent substrate;

patterning said light shield layer to thereby form a patterned light shield layer;

forming a first insulation layer above said one surface of said optically transparent substrate above which said patterned light shield layer has been formed;

forming a second insulation layer having a polishing rate lower than that of said first insulation layer, on said first insulation layer;

forming a third insulation layer having a polishing rate higher than that of said second insulation layer, on said second insulation layer; and polishing a surface of said third insulation layer.

37. An electro-optical apparatus substrate comprising a patterned light shield layer having a pattern, and an insulation film, which are sequentially formed above one surface of an optically transparent substrate, said insulation film comprising (i) a first insulation layer, (ii) a second insulation layer, which is formed on said first insulation layer and whose polishing rate is lower than that of said first insulation layer, and (iii) a third insulation layer, which is partially formed on said second insulation layer and whose polishing rate is higher than that of said second insulation layer, so that a surface of said insulation film is smoothed.

* * * * *